United States Patent
Itagaki

(10) Patent No.: US 11,295,794 B2
(45) Date of Patent: Apr. 5, 2022

(54) MEMORY SYSTEM, CONTROL METHOD, AND NON-TRANSITORY COMPUTER READABLE MEDIUM

(71) Applicant: Kioxia Corporation, Tokyo (JP)

(72) Inventor: Kiyotaro Itagaki, Naka Kanagawa (JP)

(73) Assignee: KIOXIA CORPORATION, Tokyo (JP)

(*) Notice: Subject to any disclaimer, the term of this patent is extended or adjusted under 35 U.S.C. 154(b) by 0 days.

(21) Appl. No.: 17/170,973

(22) Filed: Feb. 9, 2021

(65) Prior Publication Data

US 2021/0166743 A1  Jun. 3, 2021

Related U.S. Application Data

(63) Continuation of application No. PCT/JP2018/034080, filed on Sep. 13, 2018.

(51) Int. Cl.
*G11C 7/22* (2006.01)
*G11C 7/10* (2006.01)

(52) U.S. Cl.
CPC ............ *G11C 7/222* (2013.01); *G11C 7/1045* (2013.01); *G11C 7/1048* (2013.01); *G11C 7/1057* (2013.01); *G11C 7/1084* (2013.01)

(58) Field of Classification Search
CPC .................................. G11C 7/222; G11C 7/22
USPC ......................................................... 365/233.1
See application file for complete search history.

(56) References Cited

U.S. PATENT DOCUMENTS

| | | | |
|---|---|---|---|
| 7,560,956 B2 | 7/2009 | Waldrop | |
| 8,688,955 B2 | 4/2014 | Grunzke | |
| 9,431,078 B2 | 8/2016 | Takeyama et al. | |
| 9,792,983 B2 | 10/2017 | Hirashima et al. | |
| 10,381,055 B2* | 8/2019 | Qawami | G11C 29/023 |
| 10,636,475 B2* | 4/2020 | Jun | G11C 11/4096 |
| 2011/0055671 A1* | 3/2011 | Kim | G11C 7/222 |
| | | | 714/800 |
| 2013/0028038 A1 | 1/2013 | Fujisawa | |
| 2013/0069689 A1 | 3/2013 | Song et al. | |
| 2014/0285231 A1 | 9/2014 | Suematsu et al. | |
| 2014/0376325 A1* | 12/2014 | Tajima | G11C 7/22 |
| | | | 365/233.1 |
| 2017/0077928 A1 | 3/2017 | Bains et al. | |
| 2018/0011633 A1 | 1/2018 | Park | |

FOREIGN PATENT DOCUMENTS

| | | |
|---|---|---|
| JP | 2013030246 A | 2/2013 |
| JP | 2013069399 A | 4/2013 |
| JP | 2014102867 A | 6/2014 |
| JP | 5626669 B2 | 10/2014 |
| JP | 2014187162 A | 10/2014 |
| JP | 2017084432 A | 5/2017 |

* cited by examiner

*Primary Examiner* — Muna A Techane

(74) *Attorney, Agent, or Firm* — Holtz, Holtz & Volek PC

(57) ABSTRACT

According to one embodiment, a memory system includes a plurality of memory packages, on-die termination (ODT) circuits, and a controller. The plurality of memory packages are coupled by a common bus and arranged in groups, each group includes a pair of memory packages facing each other, and each memory package includes a plurality of memory chips. The ODT circuits are respectively disposed in the memory packages. The ODT circuits are on/off controlled based on an asserted state of a chip enable signal CEn acquired using a periodic signal of at least two cycles.

19 Claims, 16 Drawing Sheets

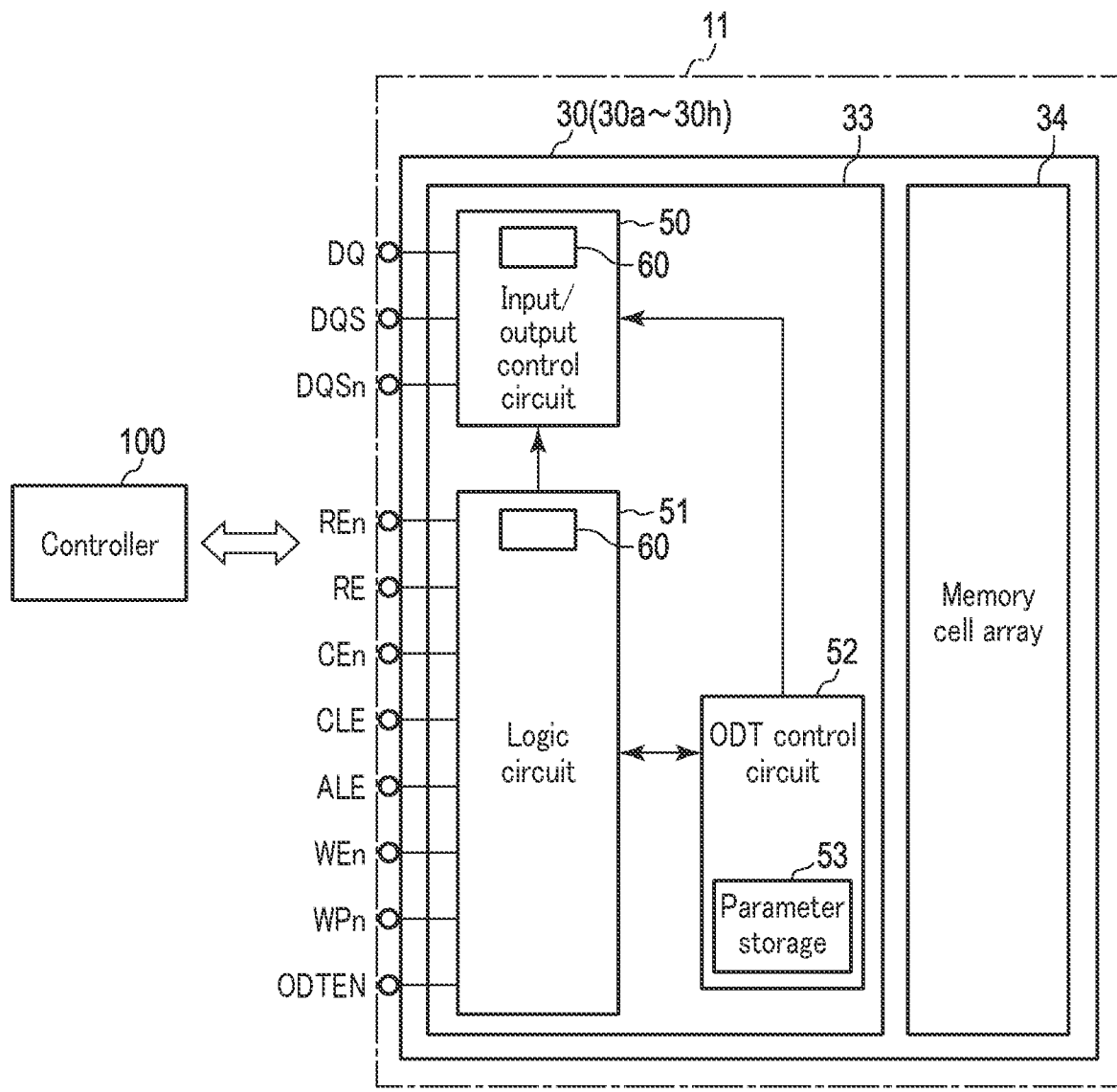
F I G. 3

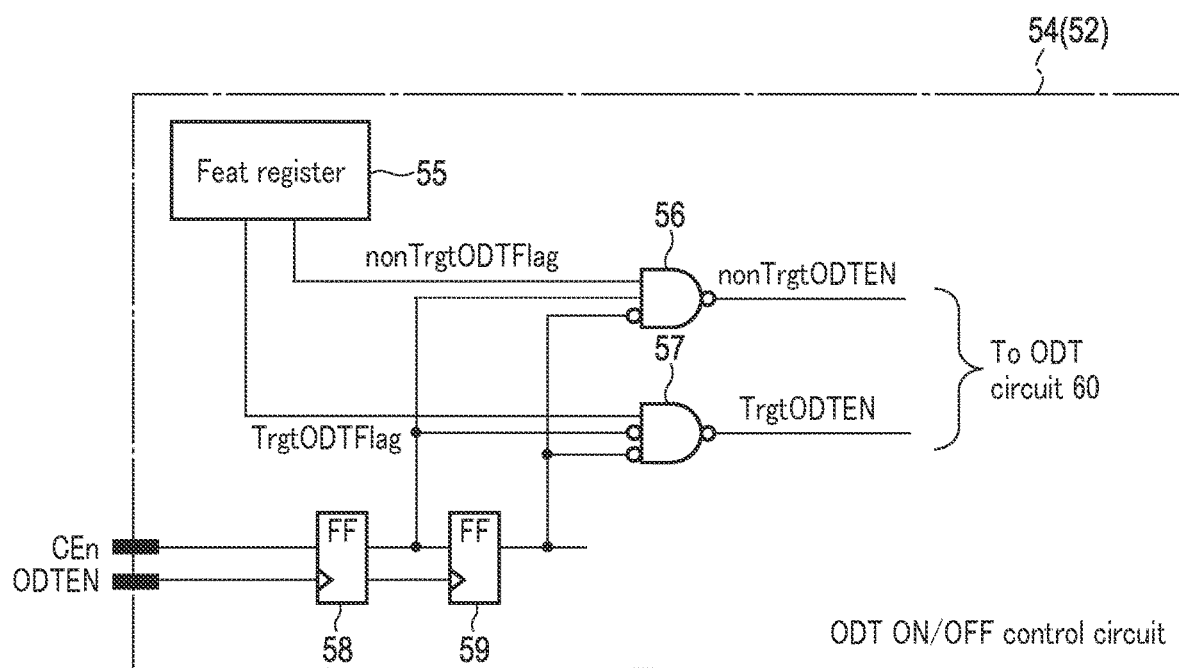
F I G. 4A

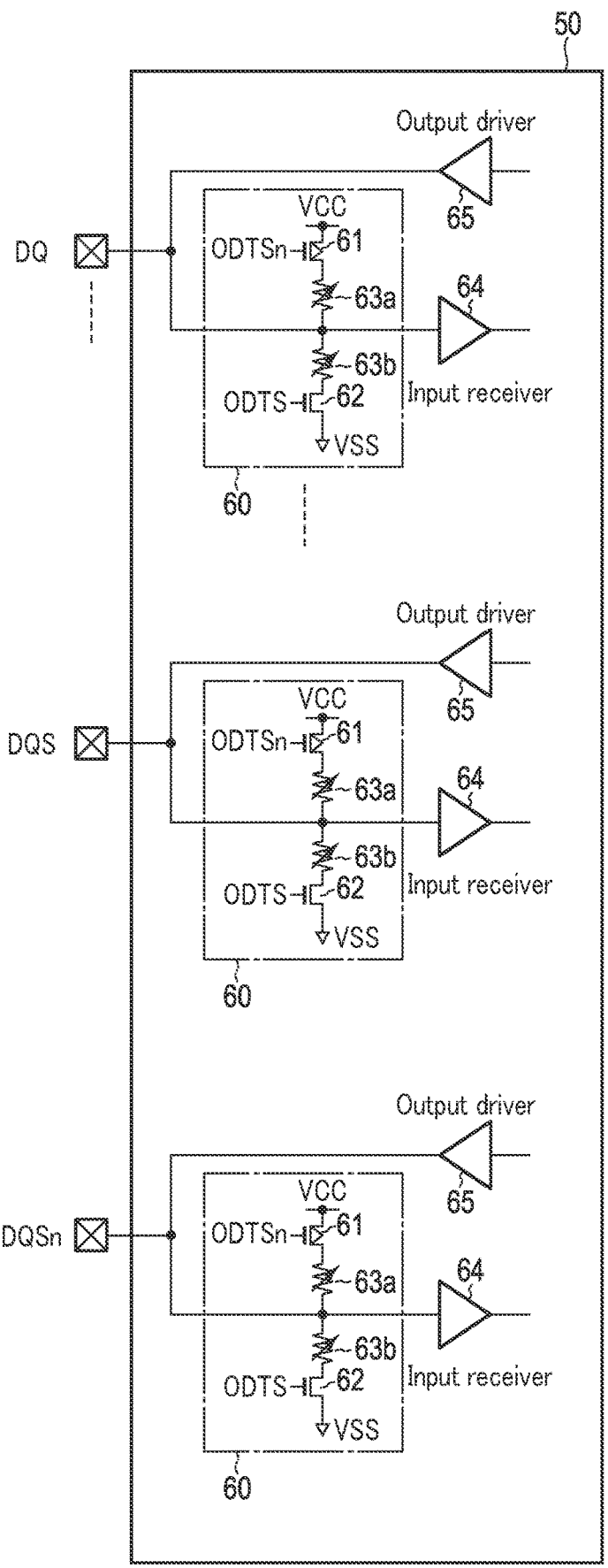
F I G. 4B

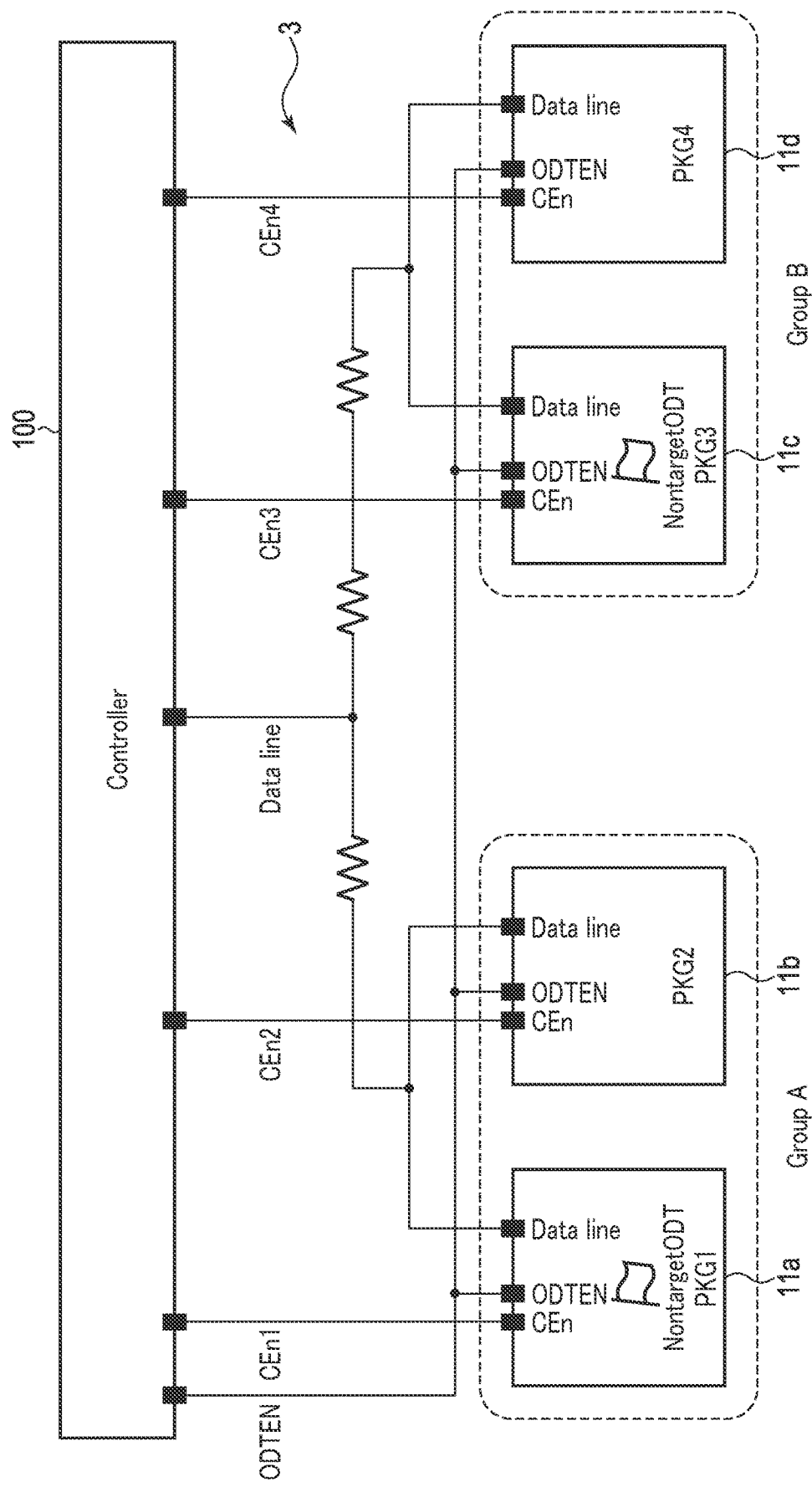
F I G. 6

| target flag | CEn | | ODTEN |
| --- | --- | --- | --- |
| | 1cyc | 2cyc | |
| Set | 0 | 0 | ON |
| | 0 | 1 | – |
| | 1 | 0 | – |
| | 1 | 1 | – |
| – | X | X | – | targetODT

FIG. 7A

| nontarget flag | CEn | | ODTEN |
| --- | --- | --- | --- |
| | 1cyc | 2cyc | |
| Set | 0 | 0 | – |
| | 0 | 1 | ON |
| | 1 | 0 | – |
| | 1 | 1 | – |
| – | X | X | – | non-targetODT

FIG. 7B

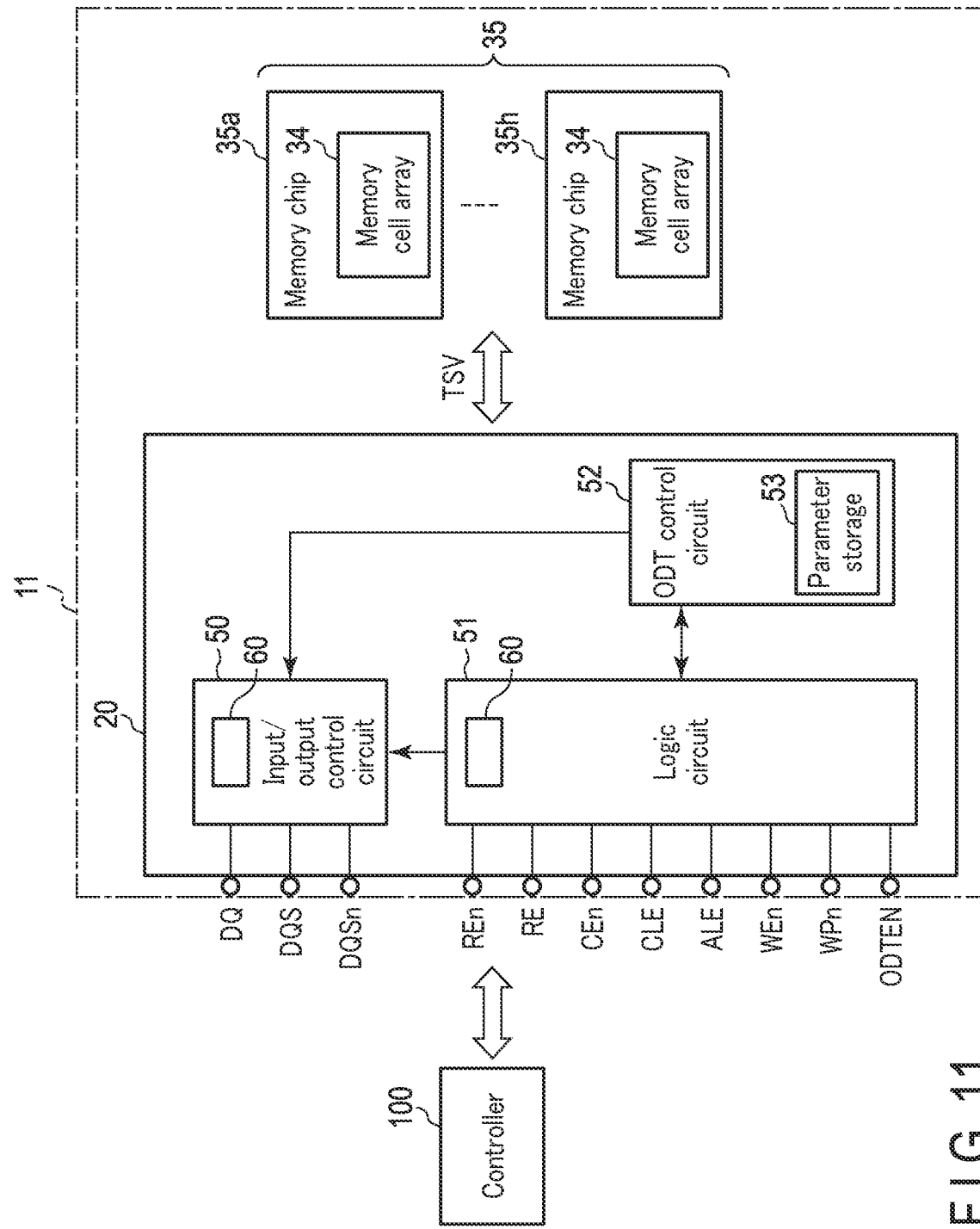
F I G. 11

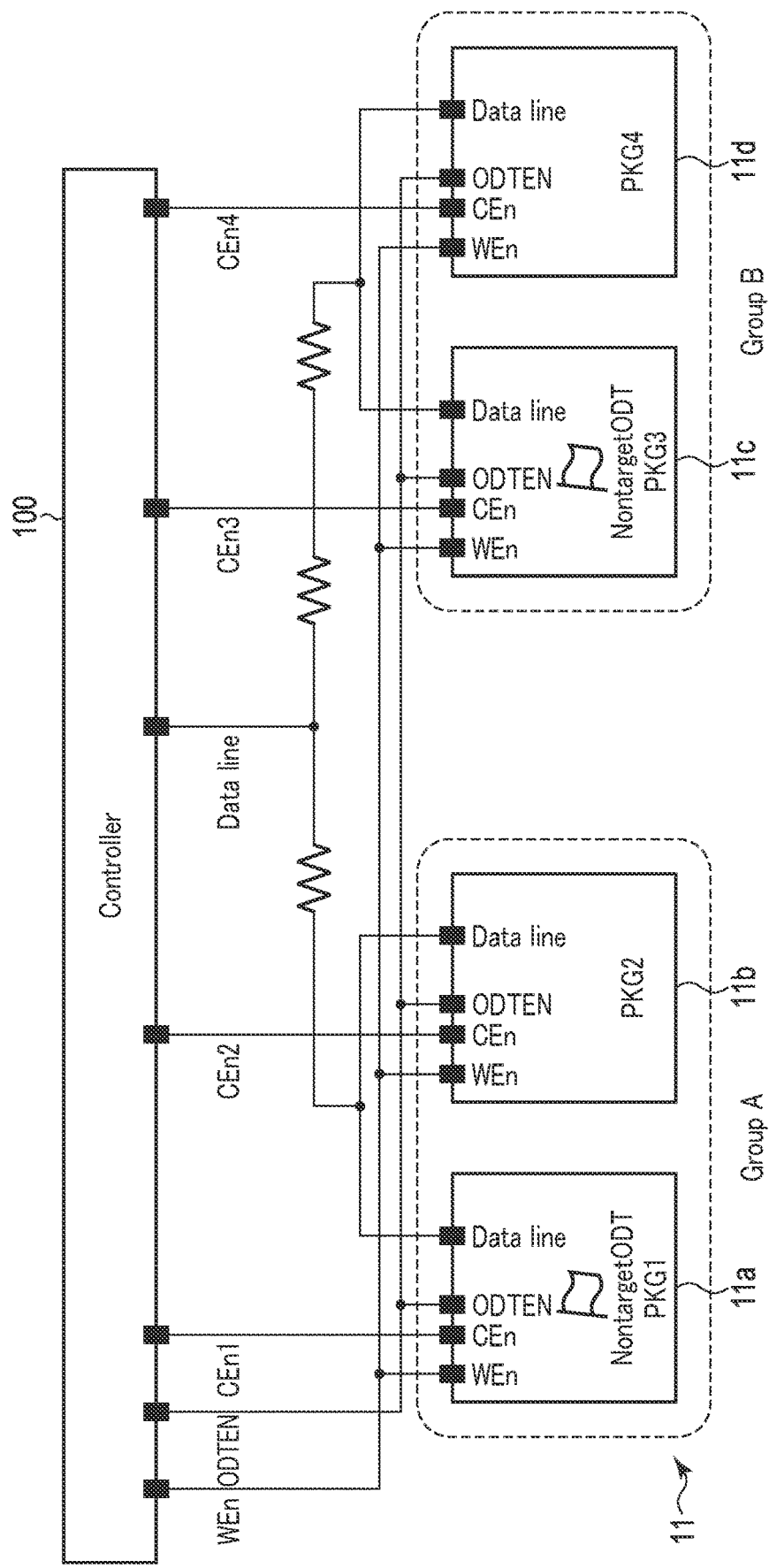
F I G. 13

MEMORY SYSTEM, CONTROL METHOD, AND NON-TRANSITORY COMPUTER READABLE MEDIUM

CROSS-REFERENCE TO RELATED APPLICATIONS

This application is a Continuation Application of PCT Application No. PCT/JP2018/034080, filed Sep. 13, 2018, the entire contents of which are incorporated herein by reference.

FIELD

Embodiments described herein relate generally to a memory system, a control method, and a non-transitory computer readable medium.

BACKGROUND

An on-die termination (ODT) technique is used to suppress reflection of a signal at a device end, which occurs when a NAND flash memory of a non-volatile semiconductor memory device is mounted on a circuit board.

BRIEF DESCRIPTION OF THE DRAWINGS

FIG. 3 is a block diagram of the non-volatile semiconductor memory device (MCP) according to the first embodiment.

FIG. 4A is a diagram showing a configuration example of an ODT on/off control circuit in an input/output control circuit in the non-volatile semiconductor memory device according to the first embodiment.

FIG. 4B is a circuit diagram schematically showing connections of input/output terminals and the input/output control circuit in the non-volatile semiconductor memory device according to the first embodiment.

FIG. 6 is a diagram schematically showing a circuit configuration of the memory system according to the first embodiment.

FIG. 7A is a diagram showing a first ODT start condition of a target ODT according to the first embodiment.

FIG. 7B is a diagram illustrating a second ODT start condition of a non-target ODT according to the first embodiment.

FIG. 11 is a block diagram of the non-volatile semiconductor memory device (TSV) according to the first embodiment.

FIG. 13 is a diagram schematically showing a circuit configuration of a memory system according to a second embodiment.

DETAILED DESCRIPTION

Figure 1:
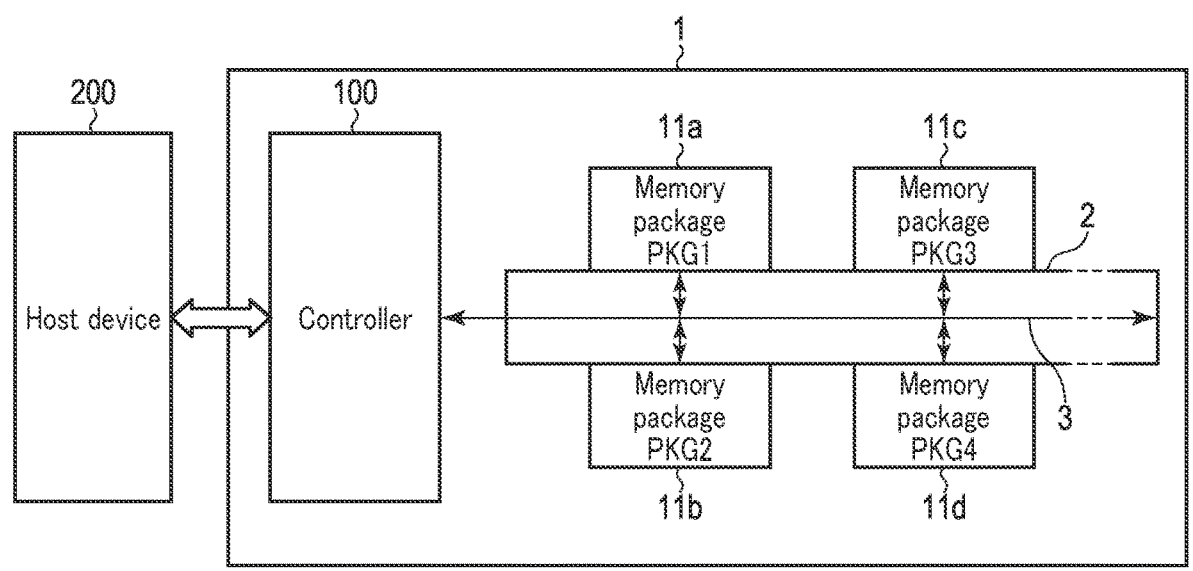
FIG. 1 is a block diagram conceptually showing a configuration of a memory system using a non-volatile semiconductor memory device according to a first embodiment.

In general, according to one embodiment, a memory system includes a plurality of memory packages, on-die termination (ODT) circuits, and a controller. The plurality of memory packages are coupled by a common bus and arranged in groups, each group includes a pair of memory packages facing each other, and each memory package includes a plurality of memory chips. The ODT circuits are respectively disposed in the memory packages. The ODT circuits are configured to suppress reflection of a signal. The controller is configured to perform writing or reading of data to or from a memory chip of a designated memory package through the common bus. The ODT circuits are on/off controlled based on an asserted state of a chip enable signal CEn acquired using a periodic signal of at least two cycles.

Hereinafter, embodiments will be described in detail with reference to the drawings.

The embodiment is a memory system 1 using a memory package 11 including, for example, a NAND flash memory which is a non-volatile semiconductor memory device. The memory system 1 mainly includes a plurality of memory packages 11 (11a to 11d) and a controller 100. The memory packages 11 are arranged in pairs to face each other with a PCB substrate (print circuit board) 2 interposed therebetween, and coupled to the controller 100 through a common bus 3. An on-die termination (ODT) circuit 60 (shown in FIG. 11 and FIG. 3) is disposed either in each of the memory packages 11 or in each of the memory chips in all memory packages to suppress signal reflection. The controller 100 writes or reads data to or from a designated memory package 11 through the common bus 3, and performs on/off control of the ODT circuit 60.

Further, the controller 100 maintains an ODT start condition for turning on the ODT circuit 60. The ODT start condition is set by a 2-bit information signal defined by a periodic signal of two cycles having at least two rising edges provided at the head of a control signal (an ODT enable signal ODTEN or a write enable signal WEn). The periodic signal in the present embodiment is equivalent to a clock signal, and has a periodic change in signal values at rising and falling edges. The two cycles are assumed to have the same period (pulse width), but may have different periods (pulse widths) depending on the design. Therefore, if one of the clock signals used in the circuit can be used for starting the ODT, the clock signal can be used as the periodic signal. The controller 100 sets the ODT circuits of the target ODT and the non-target ODT to ON by turning on the ODT circuit when the asserted state of a chip enable signal CEn acquired matches the pattern of the ODT start condition twice consecutively. When the chip enable signal CEn is switched from the asserted state to a negated state, the ODT circuit is set so as to be turned off.

First Embodiment-1 (MCP Structure)

In the present embodiment, a memory package as an example has a multi-chip package (MCP) structure in which a plurality of memory chips are obliquely stacked so that an electrode terminal of each memory chip is exposed at the end. In this MCP structure, an ODT circuit is mounted on each memory chip in the memory package.

As shown in FIG. 1, the memory system 1 mainly includes a plurality of memory packages 11 (PKG1 to PKG4: 11a to 11d) mounted on the PCB substrate 2, and a controller 100 coupled to the memory packages 11a to 11d through a bus 3 including a common bus to drive and control the memory packages. The controller 100 is coupled to an external host device 200. The controller 100 controls each of the memory packages 11a to 11d based on, for example, a command issued from the host device 200, and reads and writes data.

The memory system 1 includes a plurality of sets (groups) of pairs of memory packages 11 mounted at positions facing each other on both surfaces of the PCB substrate 2 so as to sandwich the front and back mounting surfaces of the PCB substrate 2. In this configuration example, it is assumed that a pair of memory packages 11a and 11b arranged to face each other in the group A have substantially the same bus length (length of circuit wirings) when coupled to the controller 100. Similarly, it is assumed that a pair of memory packages 11c and 11d of the group B have substantially the same bus length. Although the memory packages 11 are arranged in pairs, the number of memory packages 11 is not limited to four in the two groups, and the number of groups can be changed as appropriate in accordance with the design.

The configuration of the memory system 1 will be described in detail with reference to a cross-sectional structure of the memory package 11 shown in FIG. 2 and a block configuration shown in FIG. 3.

Inside the memory package 11, a plurality of bumps 41 serving as connection members and input/output electrodes are provided on the lower surface of the package substrate (semiconductor substrate) 40. In the case in which the memory package 11 is a ball grid array (BGA) package, hemispherical solder balls are used as the bumps 41. The package substrate 40 is electrically coupled to the controller 100 via the bumps 41 and the circuit wiring.

The memory package 11 has a structure in which, for example, eight memory chips 30 (30a to 30h) are obliquely stacked in a stepwise manner on the package substrate 40, the centers of which being shifted in an oblique direction, and electrode terminals 31, each provided at an end of one memory chip, are exposed. These electrode terminals 31 are electrically coupled to an electric circuit, such as the package substrate 40, by wire bonding using metal wirings 32.

As shown in FIG. 3, the memory chip 30 (30a to 30h) includes an interface chip 33 and a memory cell array 34. The interface chip 33 includes at least an input/output control circuit 50, a logic circuit 51, and an ODT control circuit 52. The interface chip 33 transfers data and the like between the package substrate 40 and the memory chip 30. The package substrate 40 transfers data and the like between the controller 100 and the interface chip 33.

The logic circuit 51 of the interface chip 33 is provided with terminals corresponding to read enable signals RE and REn, the chip enable signal CEn, a command latch enable signal CLE, an address latch enable signal ALE, the write enable signal WEn, a write protect signal WPn, and the ODT enable signal ODTEN. The logic circuit 51 includes, for example, an ODT circuit 60 coupled to terminals that receive the read enable signals RE and REn. The logic circuit 51 transfers the received signal to the ODT control circuit 52.

Further, the input/output control circuit 50 is provided with terminals and input/output control circuits corresponding to the data line DQ and the clock signals DQS and DQSn, respectively. The clock signal DQS is a clock signal used when data is input and output, and the clock signal DQSn is an inverted signal of the clock signal DQS. As shown in FIG. 4B, each of the DQ terminal, the DQS terminal, and the DQSn terminal is provided with one input receiver 64 and one output driver 65, which are connected in parallel, and one ODT circuit 60. Each of these terminals is coupled to an output terminal of the output driver 65. Further, each terminal is coupled to an input terminal of the input receiver 64 via the ODT circuit 60.

The ODT circuit 60 is a circuit that suppresses (or eliminates) reflection of a signal generated between the ODT circuit 60 and the outside (the controller 100) using a termination resistor at the time of input/output of data or the like. In the memory system 1, the memory chips of the respective memory packages are coupled in common to the controller 100 through the same bus 3. Therefore, the reflection of the signal from the non-selected memory chip is transmitted to the selected memory chip or the controller 100, which is the input destination of the signal. This signal reflection becomes noise in the input signal. Therefore, the ODT circuit 60 is used to suppress the signal reflection.

Here, each control signal will be described. The chip enable signal CEn is a signal for selectively enabling the memory chip of the memory package (PKG1 to PKG4) 11, and is asserted at a Low ("L") level. In the following description, the state of not being asserted is referred to as "negation". The command latch enable signal CLE is a signal indicating that an input/output signal I/O is a command, and is asserted at a High ("H") level. The address latch enable signal ALE is a signal indicating that the input/output signal I/O is an address, and is asserted at the "H" level.

The write enable signal WEn is a signal for retrieving a received information signal or data in the memory package 11, and is asserted at the "L" level each time a command, an address, data, and the like are received from the controller 100. Accordingly, each time the write enable signal WEn rises, the signal is retrieved in the memory package 11.

The read enable signals RE and REn are signals for the controller 100 to read data from the memory 10. The read enable signal REn is an inverted signal of the signal RE. For example, the read enable signal REn is asserted at the "L" level. The write protect signal WPn is a signal for instructing the prohibition of a write operation, and is asserted at the "L" level. The ODT enable signal ODTEN is a signal for controlling an on/off state of the ODT circuit 60 in the memory chip 30, and is asserted at the "H" level. In the following description, it is assumed that the target ODT and the non-target ODT are turned on and off by turning the ODT circuit 60 on and off.

The input/output control circuit 50 is coupled to the terminals corresponding to the data line DQ, and the clock signals DQS and DQSn. The input/output control circuit 50 includes ODT circuits 60 coupled to the data line DQ and the terminals corresponding to the clock signals DQS and DQSn. The input/output control circuit 50 controls input/output of an 8-bit input/output data signal IO, and the clock signals DQS and DQSn transmitted and received between the controller 100 and the memory package 11, through the data line DQ. The input/output data signal IO is an 8-bit data signal and includes various commands, addresses, data, and the like. Note that the input/output data signal IO is not limited to 8 bits and can be set as appropriate.

The ODT control circuit 52 includes a parameter storage 53. The ODT control circuit 52 controls the ODT circuits 60 incorporated in the input/output control circuit 50 and the logic circuit 51 in accordance with the parameters read from the parameter storage 53 and the ODT enable signal, and other signals transmitted from the logic circuit 51. The parameter storage 53 stores parameters related to the ODT circuits 60. The ODT control circuit 52 does not necessarily include the parameter storage 53, and the parameters may be stored in a memory area of another circuit.

An example of an ODT on/off control circuit 54 provided in the ODT control circuit 52 will be described with reference to FIG. 4A.

The ODT on/off control circuit 54 includes a Feat register 55, NAND circuits 56 and 57, and flip-flop (FF) circuits 58 and 59.

The Feat register 55 outputs a target ODT flag and a non-target ODT flag. The non-target ODT flag is input to one input terminal of the NAND circuit 56 having three input terminals, and the target ODT flag is input to one input terminal of the NAND circuit 57 having three input terminals.

The FF circuits 58 and 59 are coupled in series in two stages, and receive the chip enable signal CEn and the ODT enable signal ODTEN. The FF circuits 58 and 59 invert the chip enable signal CEn using the ODT enable signal ODTEN as a clock signal.

The FF circuit 58 of the first stage is coupled to input terminals of the chip enable signal CEn and the ODT enable signal ODTEN. The chip enable signal CEn is input to the NAND circuit 56 from the output terminal of the FF circuit 58, and the chip enable signal CEn is inverted and input to the NAND circuit 57. The chip enable signal CEn output from the first-stage FF circuit 58 is input to the input terminal of the second-stage FF circuit 59. The chip enable signal CEn is inverted and input to both the NAND circuits 56 and 57 from the output terminal of the FF circuit 59. The NAND circuit 56 outputs a non-target ODT flag to the ODT circuit 60, and the NAND circuit 57 outputs a target ODT flag to the ODT circuit 60.

Next, the configuration of the ODT circuit 60 will be described with reference to FIG. 4B.

First, the ODT circuit 60 included in the input/output control circuit 50 will be described.

As shown in FIG. 4B, the input/output control circuit 50 includes the ODT circuit 60, the input receiver 64, and the output driver 65 for each corresponding terminal.

The input receiver 64 functions as, for example, a buffer and converts an input signal from the controller 100 into a signal of a voltage level appropriate, for example, for processing in the memory package 11, and transfers the converted signal to other circuits in an interface chip 20 and the memory chip 30.

The output driver 65 functions as, for example, a buffer, converts the signal transferred from the memory chip 30 into a signal of an appropriate voltage level, and outputs the converted signal to the controller 100.

The ODT circuit 60 is provided between the terminal and the input receiver 64. The ODT circuit 60 includes a p-channel MOS transistor 61, an n-channel MOS transistor 62, and variable resistance elements 63a and 63b.

The p-channel MOS transistor 61 has a gate to which an ODTSn signal is input, a source to which a power supply voltage VCC is applied, and a drain coupled to one end of the variable resistance element 63a. The p-channel MOS transistor 61 functions as a first switch element for coupling a voltage line (power supply voltage line) to which the power supply voltage VCC is applied and the variable resistance element 63a.

The other end of the variable resistance element 63a is coupled to a wiring that couples the terminal and the input receiver and to one end of the variable resistance element 63b. The ODT control circuit 52 sets resistance values of the variable resistance elements 63a and 63b according to parameters written at the time of the set feature.

The n-channel MOS transistor 62 has a gate to which a signal ODTS is input, a drain coupled to the other end of the variable resistance element 63b, and a source to which a ground voltage VSS is applied. The n-channel MOS transistor 62 functions as a second switch element for coupling the variable resistance element 63b and a voltage line (ground voltage line) to which the ground voltage VSS is applied.

The ODT control circuit 52 provides the signal ODTS and the signal ODTSn to control the ODT circuit 60. The signal ODTSn is an inverted signal of the signal ODTS. The ODT control circuit 52 causes the ODT circuit 60 to output an "H" level signal in the case of the signal ODTS and to output an "L" level signal in the case of the signal ODTSn.

Figure 5:
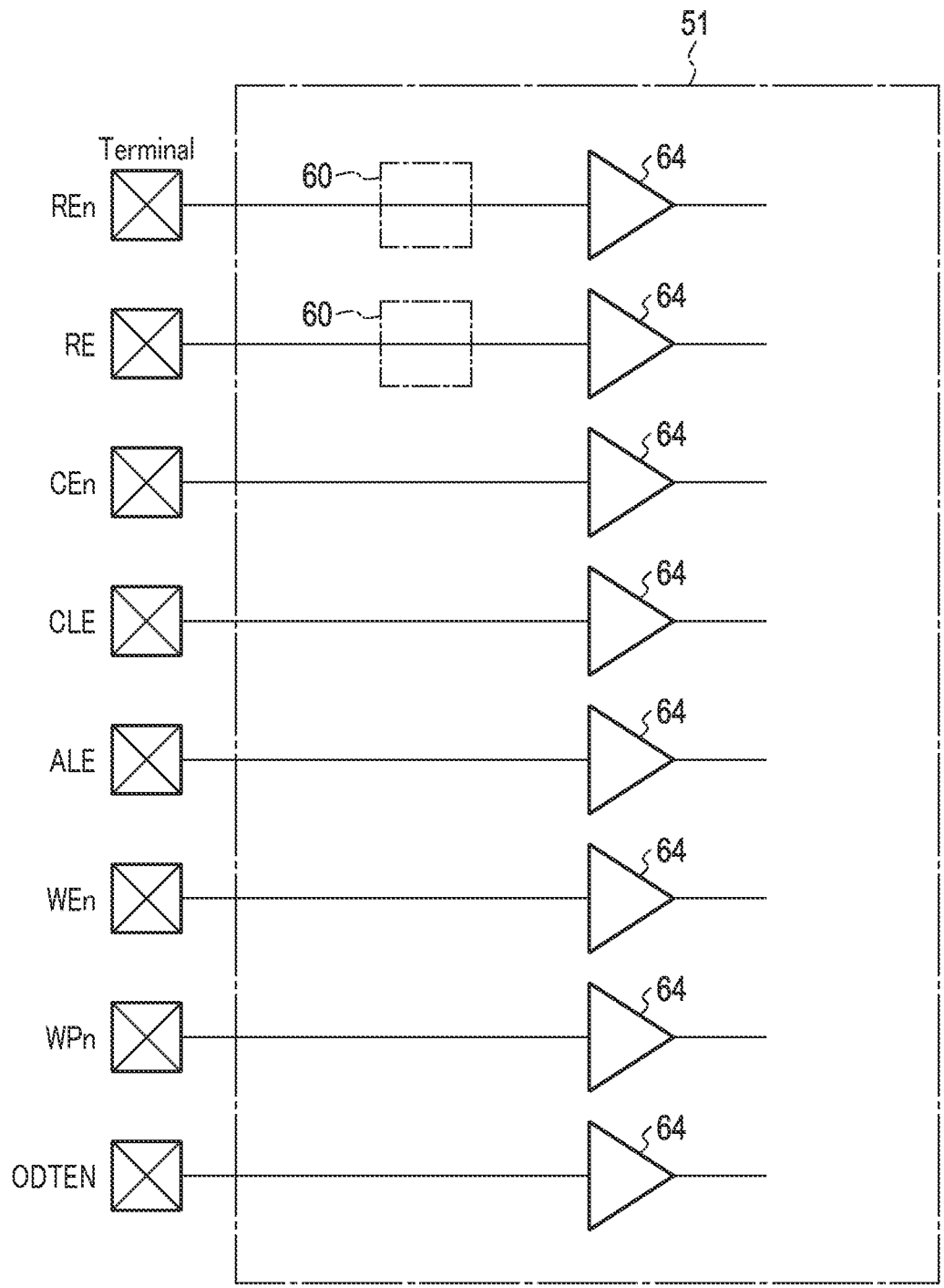
FIG. 5 is a circuit diagram schematically showing connections of a logic circuit in the non-volatile semiconductor memory device according to the first embodiment.

Next, the ODT circuit 60 included in the logic circuit 51 will be described with reference to FIG. 5. As shown in FIG. 5, the logic circuit 51 includes the input receiver 64 for each corresponding terminal. The ODT circuit 60 is provided between the input receiver 64 and each of the terminals corresponding to the read enable signals REn and RE. However, the ODT circuits 60 coupled to the terminals corresponding to the read enable signals REn and RE are not essential, and ODT circuits 60 coupled to other terminals may be used; that is, the ODT circuits 60 may be set to any terminals.

Next, ODT control of the memory package 11 in a multi-drop bus connection will be described with reference to FIG. 1 and FIG. 6 to FIG. 9A and FIG. 9B. FIG. 6 is a diagram schematically showing a circuit configuration of the memory system according to the first embodiment. As described above, the memory package 11 is formed by stacking a plurality of NAND flash memory chips. In this embodiment, as shown in FIG. 1, the memory packages 11 (11a to 11d) are mounted in pairs on the front and back mounting surfaces of the PCB substrate 2. As a coupling method for the memory packages 11, a multi-drop bus connection in which a plurality of memory packages 11 are coupled to the same bus is adopted from the viewpoint of the degree of freedom of design, and one desired memory chip is selected by using chip address information.

In the case of the multi-drop bus connection, a problem arises from signal reflection due to the configuration of a minimum of four memory packages 11 of two sets of two pairs. In the case of the multi-drop bus connection, every PCB substrate 2 exhibits different characteristics. Therefore, in order to maximize the effect of the ODT, that is, to maximize the suppression of the reflection of the signal, it is necessary to precisely control the on/off state of the ODT in units of the memory package 11 so as to match the characteristics of the PCB substrate 2.

As shown in FIG. 1 and FIG. 6, the memory packages 11a and 11b mounted on the front and back surfaces of the PCB substrate 2 so as to face each other are referred to as a "group A", and similarly, the memory packages 11c and 11d are referred to as a "group B".

The signal ODTEN is transmitted from the controller 100 to each memory package 11 through the common bus. The chip enable signal CEn is selectively transmitted from the controller 100 to each memory chip through a dedicated bus individually connected to each memory package 11.

In the present embodiment, a signal that is cycled so as to have two rising edges, for example, a periodic signal similar to a clock signal, is added to the head of the control signal input to the ODT terminal. By applying the periodic signal, multi-bit data can be transferred to the CEn terminal of each memory package 11, and the ODT circuit 60 is appropriately turned on and off. That is, one periodic signal including control information is applied to the head side of the ODT enable signal ODTEN. The signal is used as a 2-bit information signal (four patterns of 00, 01, 10, and 11) having two signal rising edges (two cycles) including the ODT enable signal ODTEN and the periodic signal. That is, the target ODT (Trgt ODT) and the non-target ODT (Non Trgt ODT) in the ODT are turned on depending on whether or not the chip enable signal CEn is asserted ("L" level). Thus, by providing one periodic signal, 2-bit information can be provided.

In the present embodiment, the asserted state of the chip enable signal CEn is defined as an ODT start condition (described later) for one pattern of the 2-bit information. Here, if the asserted state detected twice in succession constitutes a setting pattern to start the ODT, the target ODT and the non-target ODT are set to ON by turning on the ODT circuit 60. The target ODT indicates a state in which the ODT circuit 60 in the memory package 11 being accessed is turned on or off in order to read or write data. The non-target ODT indicates a state in which the ODT circuit 60 is turned on or off in order to eliminate reflection of a signal generated when another memory package 11 is accessed.

The width of one cycle (from a rising edge to another rising edge of the signal) of the periodic signal is about four times the switching timing of the write enable signal WE; for example, about 100 nsec at a maximum to 25 nsec at a minimum.

Figure 8:
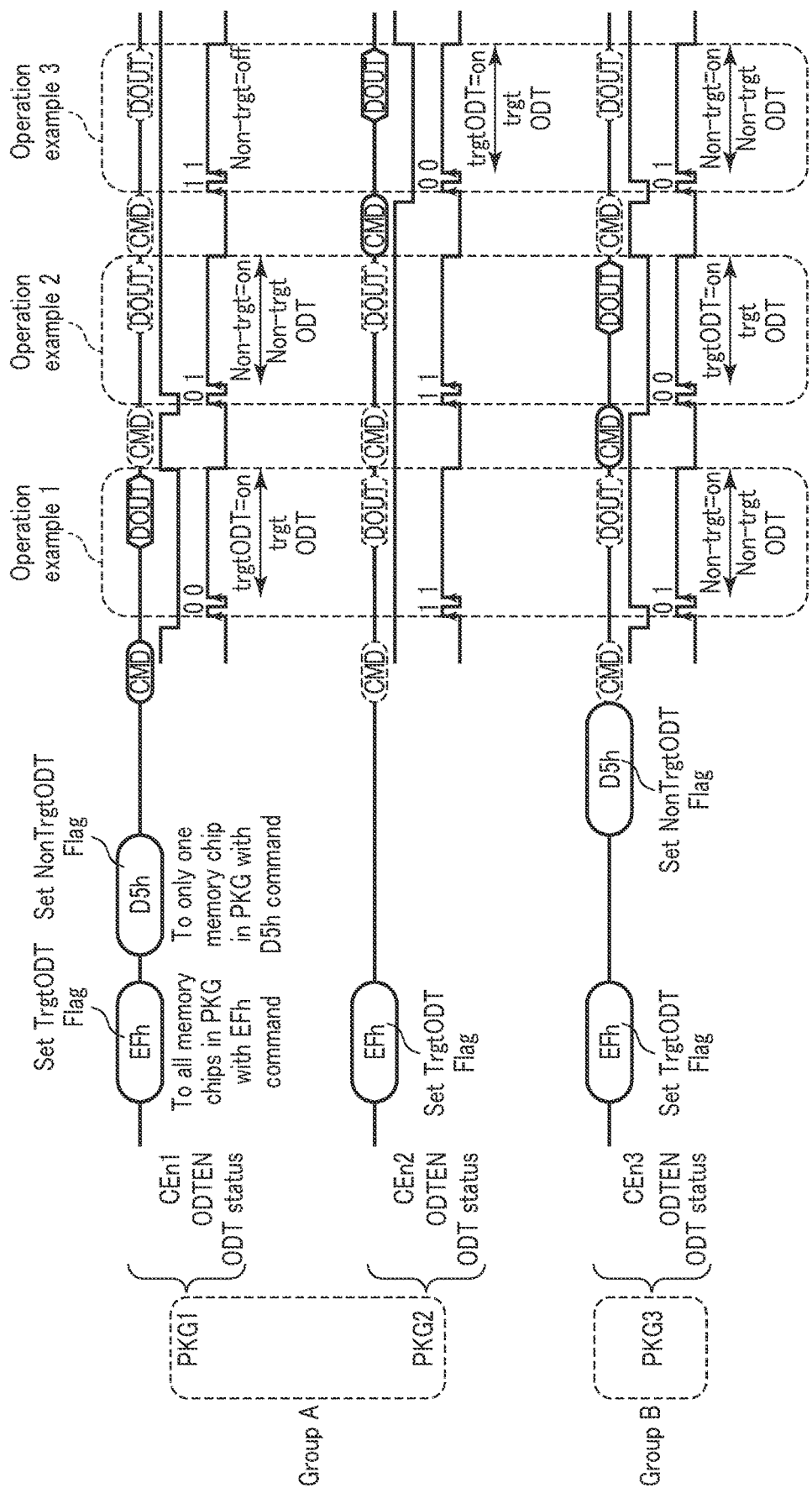
FIG. 8 is a timing chart for explaining on/off states of the ODT in a data read operation of the memory system according to the first embodiment (MCP).

First, the relationship between the periodic signal applied to the ODT enable signal ODTEN and the chip enable signal CEn will be described with reference to FIG. 7A, FIG. 7B, and FIG. 8.

Here, an EFh command, a D5h command (a set future command with a chip address), the ODT enable signal ODTEN, and the chip enable signal CEn input to the memory package 11a (PKG1) shown in FIG. 8 will be described as an example. The ODT enable signal ODTEN includes an information signal of two cycles (2 bits) with at least one periodic signal applied to the head side. In the following description, the "L" level of the chip enable signal CEn shown in FIG. 7A, FIG. 7B, and FIG. 8 indicates "0", and the "H" level thereof indicates "1". It should be noted that the number of cycles of the periodic signal may be set as appropriate in accordance with a desired amount of information, and is not limited.

FIG. 7A shows two values (truth values) of the chip enable signal CEn indicating a first ODT start condition for turning on the target ODT. Here, in a state in which the target ODT flag is set, when the chip enable signal CEn "0" is continuously acquired as "0" and "0" at the timing of two rising edges (first and second cycles) of the periodic signal, the first ODT start condition is satisfied and the ODT circuit 60 is set so as to be turned on. Otherwise, when "1" is included in the output of the chip enable signal CEn at the timing of first or second cycle of the periodic signal (["0", "1"], ["1", "0"], and ["1", "1"]), the ODT circuit 60 is set so as not to be turned on. If the target ODT flag is not set, the detection based on the first ODT start condition is not performed.

Specifically, in order to turn on the ODT circuit 60, first, the target ODT flag must be set. In this example, the target ODT flag is set for all chips in each memory package 11 by the EFh command from the controller 100.

Next, for all chips in which the target ODT flag is set, in order to activate only one memory chip, the chip enable signal CEn is asserted ("L" level). At this time, the chip enable signal CEn is set to an assert time including a data reading (DOUT) time. For example, when the chip enable signal Cen is asserted (L level) in the memory package 11a (PKG1) of the group A shown in FIG. 8, if periodic signals of two cycles are input, "0" is acquired in the first cycle and "0" is acquired in the second cycle. At this time, the ODT circuit 60 may be turned on, the target ODT may be set to be on, and the data read operation DOUT may be performed.

When the "H" level chip enable signal CEn, which is a negate signal, is input to the memory package 11b (PKG2) of the group A, the ODT enable signal ODTEN to which the periodic signal is applied is input. At this time, the first cycle of the periodic signal becomes "1" and the second cycle becomes "1", and the ODT circuit 60 is not turned on.

Next, FIG. 7B shows two values (truth values) of the chip enable signal CEn indicating a second ODT start condition for turning on the non-target ODT in one selected memory chip in the memory package 11. In a state in which the non-target ODT flag is set, and in a case where a period of the chip enable signal CEn being asserted is 5 μsec to 10 μsec, if the chip enable signal CEn is "0" at the timing of the first cycle and the chip enable signal CEn is "1" at the timing of the second cycle in the two rising edges (first and second cycles) of the periodic signal, the non-target ODT circuit 60 is set so as to be turned on. This setting is different from the setting of the first ODT start condition of "0" and "0" in the target ODT described above. Otherwise, when the output of the chip enable signal CEn is (["1", "0"], ["0", "0"], and ["1", "1"]) at the timings of the first and second cycles of the periodic signal, the non-target ODT is set so as not to be turned on.

Next, with reference to FIG. 8, an operation of the memory package 11 of the groups A and B by the chip enable signal CEn and the ODT enable signal ODTEN to which periodic signal is applied at the head will be described. Here, the memory packages 11a to 11c (PKG1 to PKG3) are representatively shown.

For example, after the power has been turned on, the controller 100 executes a parameter writing operation (Set Feature) and sets various parameters. At this time, the controller 100 sets the memory chip 30, in which the ODT circuit 60 is turned on, in each memory package 11.

First, in order to turn on the ODT circuit 60, the target ODT flag must be set. In this example, the EFh command is issued from the controller 100, and the target ODT flag is set for all the memory chips 30 in each of the memory packages 11a to 11d (PKG1 to PKG4).

Next, after the target ODT flag is set, a command for executing the Set Feature, for example, a D5h command is issued, and the non-target ODT flag is set in the one selected memory chip of each memory package 11. In this example, the non-target ODT flag is set in one of the memory packages 11a and 11c (PKG1 and PKG3). When the target ODT flag is set, it is continuously done so with a time difference so as not to be simultaneously set in a plurality of memory packages 11, unless the D5h command has the same chip address.

Next, Operation Examples 1 to 3 of continuous reading of data from the memory chip of the memory package 11 will be described.

Figure 9A:
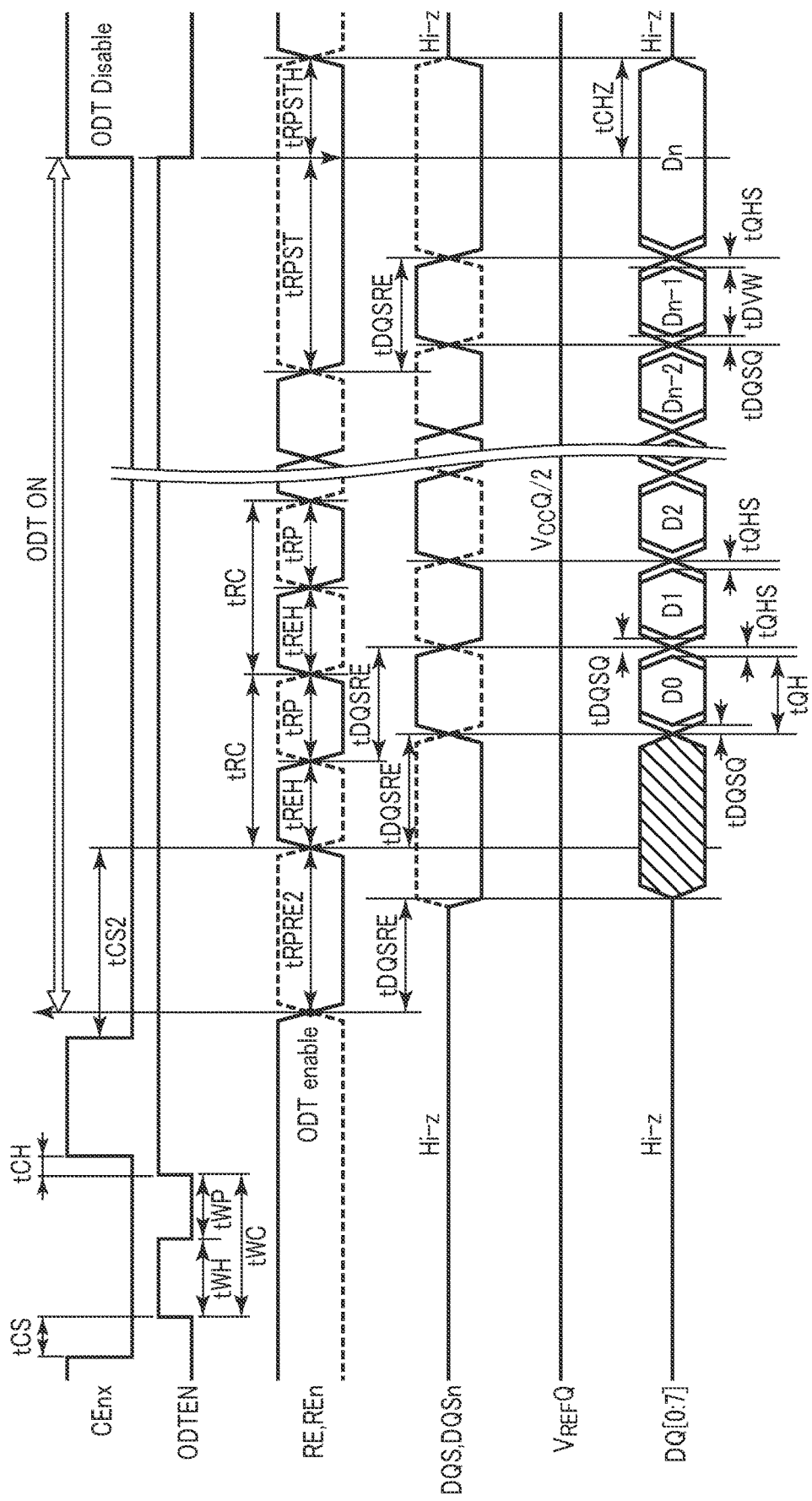
FIG. 9A is a timing chart for explaining a data read operation of the memory system according to the first embodiment.
Figure 9B:
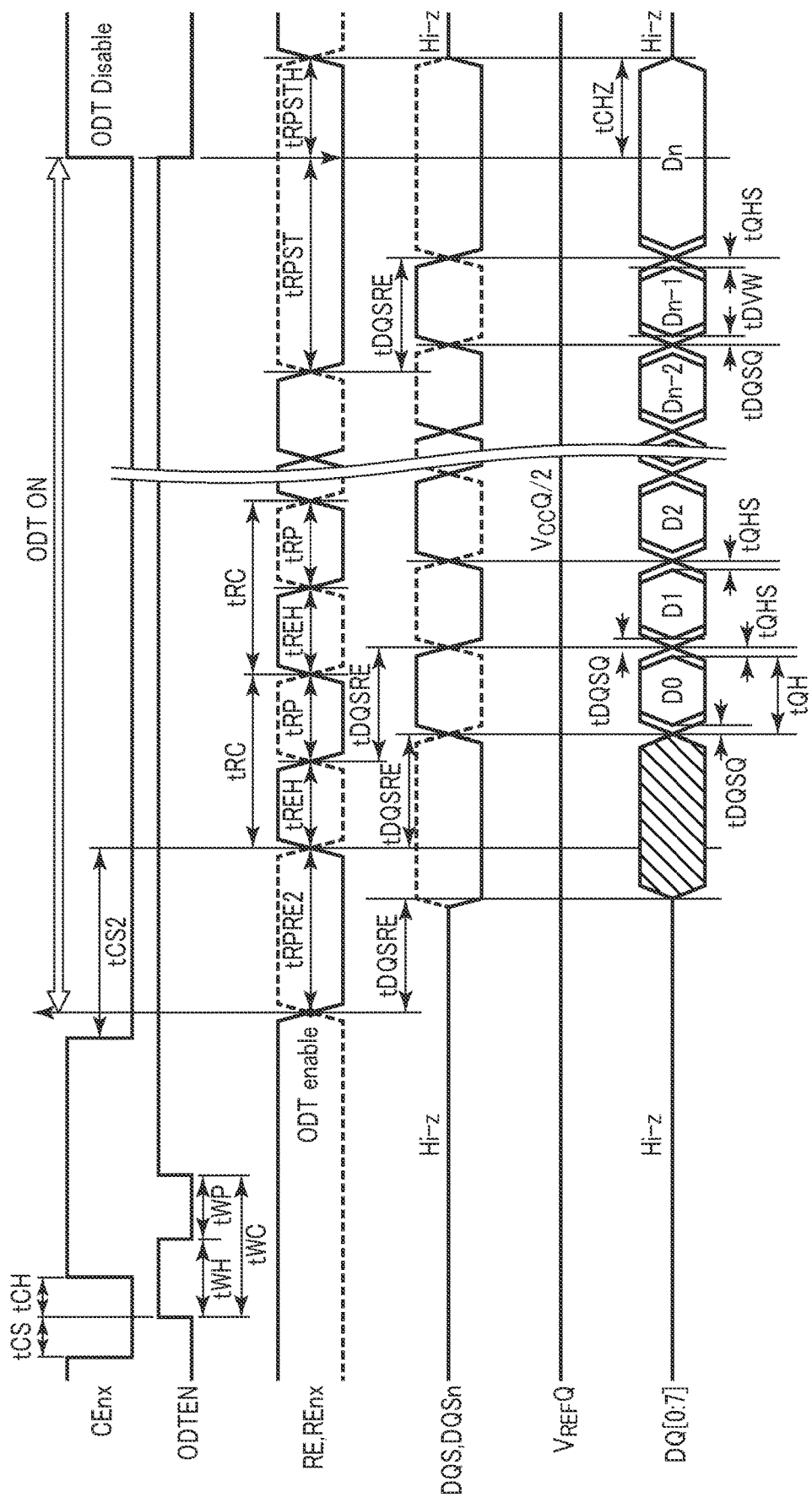
FIG. 9B is a timing chart for explaining a data read operation of the memory system according to the first embodiment.

[Operation Example 1] First, a description of [Operation Example 1] for the reading of data from one memory chip in the memory package 11a (PKG1) will be provided. FIG. 9A and FIG. 9B are timing charts for reading data during the assertion (L level) period of the chip enable signal CEnx. Here, FIG. 9A is a timing chart for turning on the target ODT, and FIG. 9B is a timing chart for turning on the non-target ODT. The difference between the timing chart for turning on the target ODT and the timing chart for turning on the non-target ODT is whether or not the chip enable signal CEnx is in an asserted state, as will be described later.

After setting the non-target ODT flag, the controller 100 issues a command (CMD) for data reading (DOUT) to all the memory chips. In response to this command, for example, in order to activate only one memory chip of the memory package 11a (PKG1) of the group A, the chip enable signal CEn1 is asserted (L level) as shown in FIG. 8. Next, after the assertion (L level) of the chip enable signal CEn1 has commenced, the ODT enable signal ODTEN is input, and a value of "0" is acquired in the first cycle and a value of "0" is acquired in the second cycle with respect to the periodic signal applied to the head. As "0" and "0" are acquired in the two cycles, the first ODT start condition shown in FIG. 7A is satisfied, and the ODT circuit 60 of the target ODT is turned on.

At the same time, the chip enable signal CEn to be asserted is input to the memory package 11c (PKG3) of the group B in order to set the non-target ODT. The chip enable signal CEn has a short assertion period, and when the ODT enable signal ODTEN is input, only the first cycle becomes "0" and the second cycle becomes "1". As the values "0" and "1" are acquired, the second ODT start condition is satisfied, and the ODT circuit 60 of the non-target ODT of one memory chip of the memory package 11c (PKG3) is turned on.

At this time, even when the same ODT enable signal ODTEN is input to the memory package 11b (PKG2) paired with the memory package 11a, the memory chip of the memory package 11b is not activated because the chip enable signal CEn input to the memory package 11b is not asserted ("H" level).

Next, after the ODT circuit 60 is turned on, the data read operation (DOUT) is performed. In this case, the data read operation is started, for example, after 300 nsec have elapsed since the command (CMD) was input. The data read from the memory chip of the memory package 11a (PKG1) is output to the controller 100 through the signal line DQ.

Specifically, in a data read operation (DOUT), as shown in FIG. 9, after the ODT circuit 60 is turned on, the read enable signals RE and REn1 begin to toggle, and a TrEH signal and a TRp signal are alternately output. After receiving the read enable signals RE and REn1, the memory chip outputs data D0, D1 . . . Dn-1 corresponding to the clock period in synchronization with the clock signals DQS and DQSn1 for data reading transmitted after a set time (tDQSRE). Further, when the assertion of the chip enable signal CEn is ended, the ODT circuit 60 is also turned off.

[Operation Example 2] Next, a description of [Operation Example 2] for the reading of data from one memory chip in the memory package 11c (PKG3) will be provided.

After the data reading in the Operation Example 1 described above, the controller 100 issues the command (CMD) for data reading (DOUT) to all the memory chips. Subsequently, for example, in order to activate only one memory chip of the memory package 11c (PKG3) of the group B, the chip enable signal CEn is asserted ("L" level).

As described above, when the chip enable signal CEn is asserted ("L" level), the ODT enable signal ODTEN is also input to the memory chip of the memory package 11c (PKG3), and the first cycle becomes "0" and the second cycle becomes "0" with respect to the periodic signal applied to the head. At this time, the ODT circuit 60 is turned on, and the data read operation (DOUT) is performed.

At the same time, the chip enable signal CEn of a short assertion period for setting the non-target ODT, in which the first cycle is "0" and the second cycle is "1", is input to the memory package 11a (PKG1) of the group A.

By the input of the chip enable signal CEn, the non-target ODT is set in the memory chip of the memory package 11a (PKG1). As described above, even when the same ODT enable signal ODTEN is input to the memory package 11b (PKG2) paired with the memory package 11a, the memory chip of the memory package 11b is not activated because the chip enable signal CEn input to the memory package 11b is negated ("H" level).

[Operation Example 3] Further, a description of [Operation Example 3] for the reading of data from one memory chip in the memory package 11b (PKG2) will be provided.

After the data reading of the Operation Example 2 described above, the controller 100 issues the command (CMD) of the data reading (DOUT) to all the memory chips. Subsequently, as described above, the chip enable signal CEn is input to one memory chip of the memory package 11b (PKG2) of the group A. When the chip enable signal CEn is asserted (L level), the ODT enable signal ODTEN is input, and the first ODT start condition in which the first cycle is "0" and the second cycle is "0" is acquired with respect to the periodic signal applied to the head. In accordance with the first ODT start condition, the ODT circuit 60 is turned on to execute the data read operation (DOUT).

At the same time, the chip enable signal CEn in which the assertion period is set is input to the memory package 11c (PKG3) of the group B so that only the first cycle becomes "0" and the second cycle becomes "1". Through the input of the chip enable signal CEn, the non-target ODT is set in the memory chip of the memory package 11c (PKG3). Also in this operation example, as described above, even when the same ODT enable signal ODTEN is input to the memory package 11a (PKG1) paired with the memory package 11b, the memory chip of the memory package 11a is not activated because the chip enable signal CEn input to the memory package 11a is negated ("H" level).

Here, a malfunction in the ODT control that can be prevented by the present embodiment will be described. For example, a configuration is assumed, as an example, in which the ODT circuit is turned on depending on whether the chip enable signal CEn is asserted ("L" level) upon a rise in the signal ODTEN (the signal ODTEN to which the periodic signal is not applied or the signal ODTEN in which the leading side of the signal ODTEN is not pulsed). A malfunction is likely to occur in [Operation Example 3] in FIG. 8 described above. Normally, when the ODT enable signal ODTEN is input while the chip enable signal CEn is asserted ("L" level), the target ODT is turned on. Conversely, when the ODT enable signal ODTEN is input while the chip enable signal CEn is negated ("H" level), the ODT circuit of the non-target ODT is set so as to be turned on.

First, in the memory package 11a (PKG1) of the group A, the target ODT flag and the non-target ODT flag are set in the selected memory chip. Under this flag setting state, the memory chip of the memory package 11b (PKG2) is accessed by the command, and the chip enable signal CEn2 to be asserted is input. When the ODT enable signal ODTEN is input in the asserted state, the ODT circuit of the target ODT is turned on. At the same time, as a normal operation, the non-target ODT is turned on in another memory package 11c (PKG3).

Further, the non-target ODT flag is set in one memory chip in the memory package 11a (PKG1). For this reason, if the ODT enable signal ODTEN is input when the chip enable signal CEn is not asserted, a malfunction resulting in the non-target ODT being turned on occurs in the memory chip. This leads to the ODT circuits 60 of both the memory packages 11a (PKG1) and 11b (PKG2) in the same group being turned on.

In contrast, according to the present embodiment, in order to turn on the non-target ODT, the chip enable signal CEn with a short assertion period is generated, and the ODT enable signal ODTEN to which the periodic signal is applied at the head is used. Thus, even when the two flags of the target ODT flag and the non-target ODT flag are set, the target ODT and the non-target ODT can be distinguished from each other, and the ODT control is performed without a malfunction.

The confirmation of the presence or absence of the ODT of the target ODT flag and the non-target ODT flag, the setting and determination of the ODT start conditions (the first ODT start condition and the second ODT start condition), and the acquisition of the asserted state of the chip enable signal CEn are executed by a hardware processor provided in the controller with program software or application software stored in the controller 100. On the basis of arithmetic processing results of the software, the controller 100 drives and controls the components responsible for the functions.

As described above, according to the present embodiment, it is possible to provide a non-volatile semiconductor memory device and a control method capable of improving the processing capacity without a malfunction.

Specifically, the ODT enable signal ODTEN having the periodic signal applied to the head can set at least four ODT start conditions by two cycles. Since the ODT is not started in a state in which the ODT start condition is not satisfied, a malfunction can be prevented. The number of cycles of the periodic signal can be increased or decreased in accordance with the amount of information (multi-bit information). Since the asserted state of the chip enable signal CEn is continuously detected twice, the accuracy of the operation can be ensured. Further, it is possible to realize a precise control of the on/off of the ODT without increasing the number of control pins, while minimizing the overhead of the data transfer throughput without increasing the number of control pins.

Conventionally, a command is issued each time data is transferred, and ON/OFF of the ODT circuit is specified on a chip basis. Therefore, an overhead time due to issuance of an ODT specifying command is required. The issuance of the ODT specifying command is simplified, the overhead time can be shortened, and the data transfer throughput can be improved.

First Embodiment-2 (TSV Structure)

Figure 10:
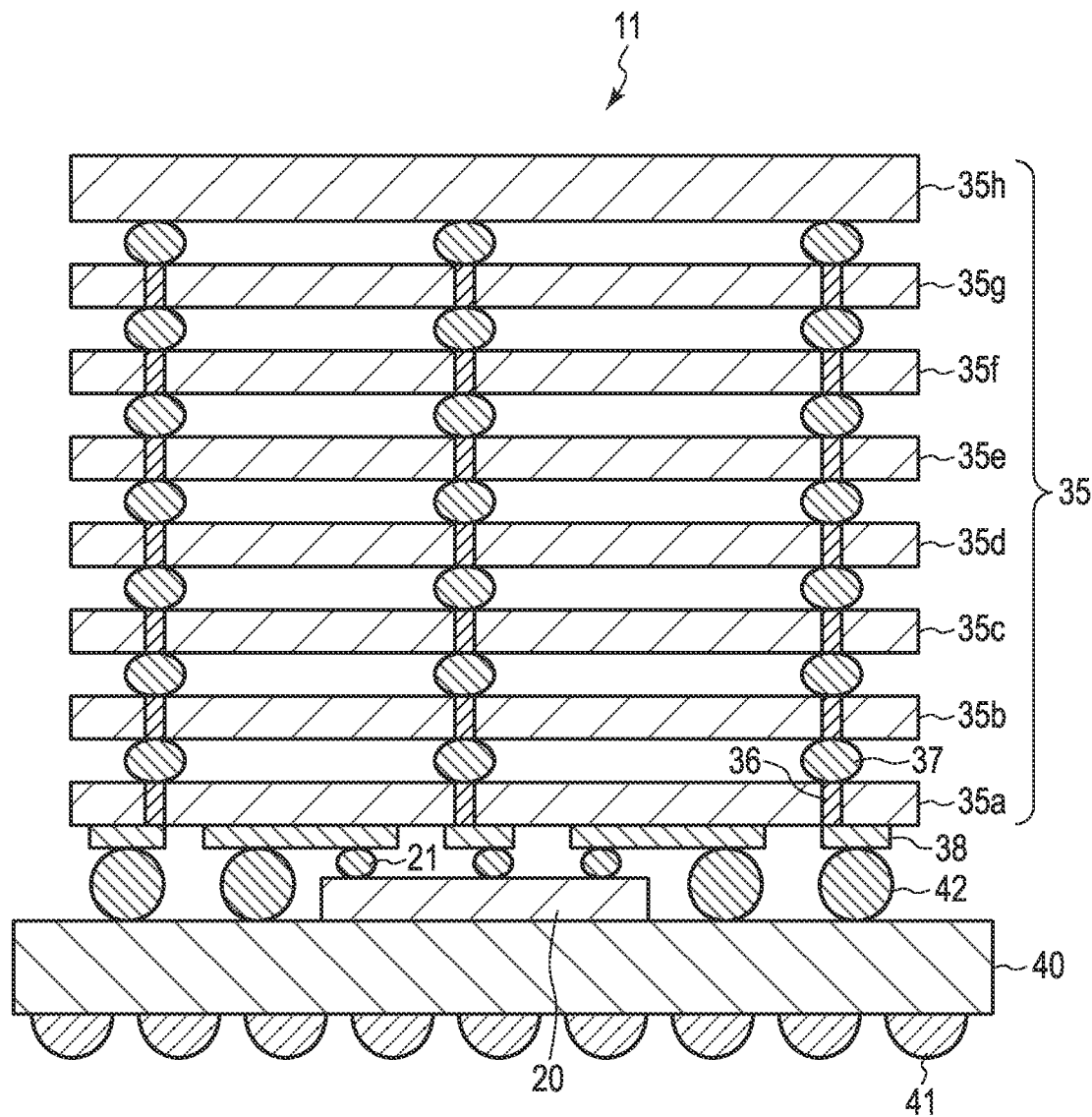
FIG. 10 is a cross-sectional view of a non-volatile semiconductor memory device (TSV) according to the first embodiment.

FIG. 10 is a diagram showing a cross-sectional structure of a memory package 11 having a TSV structure, and FIG. 11 is a diagram showing a block configuration of the memory package 11. The same reference numerals are given to components of the TSV structure that are the same as the components of the MCP structure described above, and descriptions thereof are omitted.

In the present embodiment, the memory package as an example has a TSV structure in which a plurality of memory chips 35 are stacked in the vertical direction and coupled through feedthrough electrodes (through silicon vias (TSVs)) 31. Both Embodiment-1 and Embodiment 2 fall within a category of the multi-chip package structure. However, since they are different in the arrangement of the ODT circuit, the cross-sectional structure shown in FIG. 10 is referred to as a "TSV structure" and will be described to ensure distinction from the MCP structure of the cross-sectional structure shown in FIG. 2.

In the memory package 11, a plurality of bumps 41 are provided on the lower surface of a package substrate 40 as in the MCP structure. The package substrate 40 is electrically coupled to the controller 100 via the bumps 41 and the circuit wiring.

One interface chip 20 is disposed on the main surface of the package substrate 40. Furthermore, for example, eight memory chips 35 (35a to 35h) are stacked in the vertical direction on the main surfaces of the interface chip 20 and the package substrate 40. The eight memory chips 35a to 35h are stacked upward from the package substrate 40 side such that the chip centers coincide in the vertical direction.

Each of the memory chips 35a to 35g, excluding the memory chip 35h of the uppermost layer, is provided with through silicon vias (TSVs) 36 extending from the upper surface to the lower surface thereof. A bump 37 is provided between two adjacent memory chips 35 to electrically couple the TSVs 36 of the respective memory chips 35. The memory chip 35h of the uppermost layer may also include a TSV 36. A wiring 38 is provided on the lower surface of the lowermost memory chip 35a. A bump 21 is provided between the wiring 38 and the interface chip 20. Similarly, a bump 42 is provided between the lowermost wiring 38 and the package substrate 40.

The memory system 1 using the memory chips 35 of the TSV structure also includes a plurality of sets (groups) of pairs of memory packages 11 mounted at positions facing each other so as to sandwich the front and back mounting surfaces of the PCB substrate 2. Also in this configuration example, it is assumed that a pair of memory packages 11a and 11b arranged to face each other in the group A have substantially the same bus length (length of circuit wirings) coupled to the controller 100. Similarly, it is assumed that a pair of memory packages 11c and 11d of the group B have substantially the same bus length. Although the memory packages 11 are arranged in pairs, the number of memory packages 11 is not limited to four in two sets (groups), and the number of memory packages can be changed as appropriate.

In the present embodiment, the memory chip 30 of the MCP structure and the memory chip 35 of the TSV structure are exemplified by a three-dimensional stacked NAND flash memory including a memory cell array 34 in which memory cells are three-dimensionally arranged above the semiconductor substrate, but may also be a planar NAND flash memory including a memory cell array in which memory cells are two-dimensionally arranged on the semiconductor substrate.

Next, a block configuration of the interface chip 20 and the memory chip 35 in the memory package 11 will be described with reference to FIG. 11.

Each of the memory chips 35 (35a to 35h) transmits and receives data and the like to and from the controller 100 via one interface chip 20 disposed in the package. Each memory chip 35 includes a memory cell array 34 for storing data and the like.

The interface chip 20 includes an input/output control circuit 50, a logic circuit 51, and an ODT control circuit 52, and is equivalent in configuration to that shown in FIG. 3. An ODT circuit 60 is provided in the input/output control circuit 50 and the logic circuit 51. The ODT control circuit 52 includes a parameter storage 53. The parameter storage 53 stores parameters related to the ODT circuit 60. The ODT control circuit 52 does not necessarily include the parameter storage 53, and the parameters may be stored in a memory area of another circuit.

The ODT control circuit 52 controls the ODT circuits 60 incorporated in the input/output control circuit 50 and the logic circuit 51 in accordance with the parameters read from the parameter storage 53 and the ODT enable signal and other signals transmitted from the logic circuit 51.

The control signals (chip enable signal CEn and the like) of the input/output control circuit 50 and the logic circuit 51 are the same as those in the circuit configuration shown in FIG. 3 described above, and the description thereof is omitted here.

Figure 12:
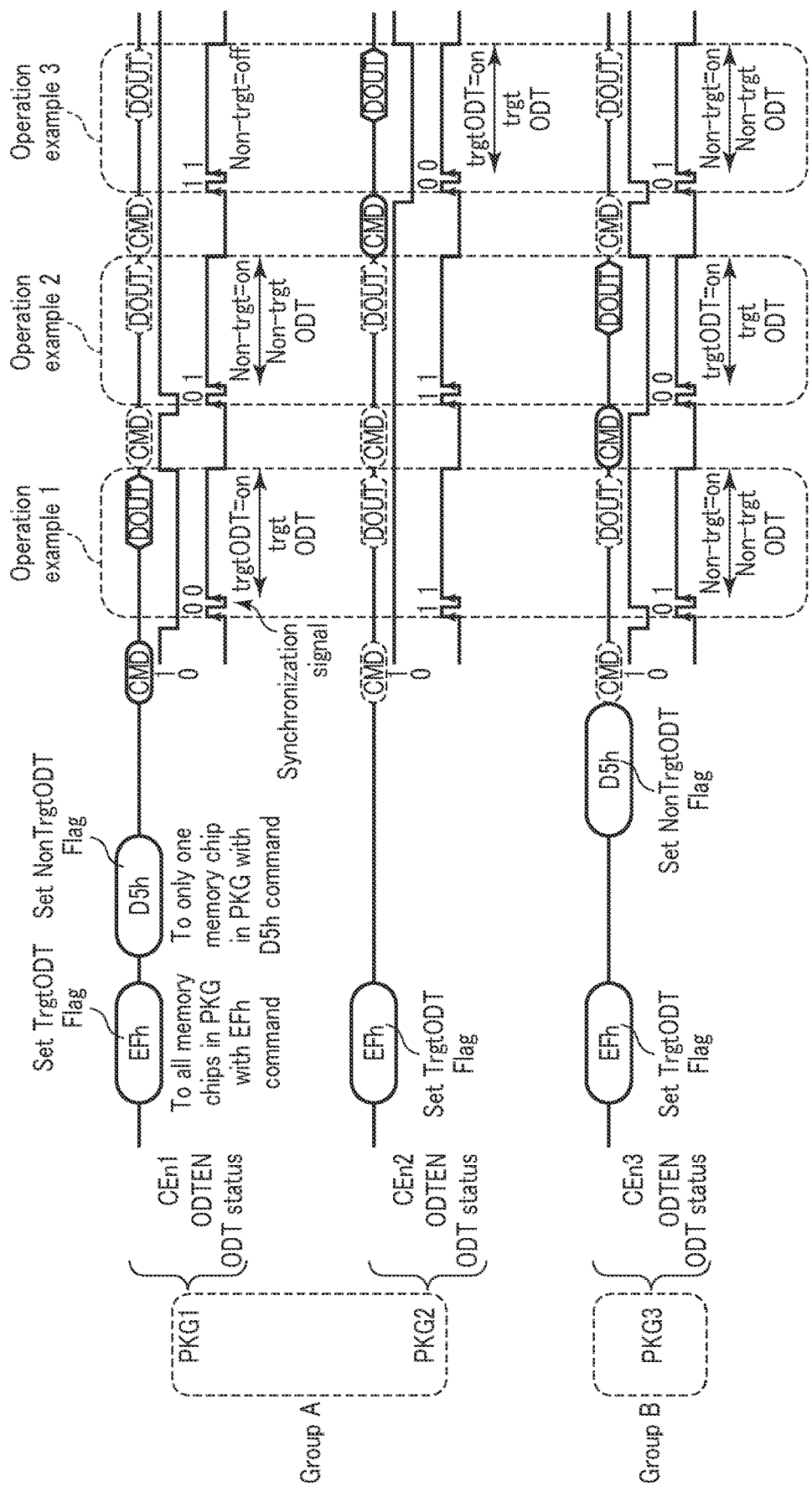
FIG. 12 is a timing chart for explaining a data read operation of the memory system according to the first embodiment (TSV).

Next, ODT control of the memory package 11 in a multi-drop bus connection using the memory chip 35 of the TSV structure will be described with reference to FIG. 12.

The memory packages 11 are mounted in pairs on the front and back mounting surfaces of the PCB substrate 2 in the same manner as shown in FIG. 1. That is, the memory packages 11a and 11b mounted on the front and back surfaces of the PCB substrate 2 so as to face each other are referred to as a "group A", and similarly, the memory packages 11c and 11d are referred to as a "group B". In the case of the multi-drop bus connection, characteristics are different in every PCB substrate. Therefore, in order to maximize the effect of the ODT, that is, to maximize the suppression of the reflection of the signal, it is necessary to precisely control the on/off of the ODT in units of the interface 20 of the memory package 11 so as to match the characteristics of the PCB substrate.

First, an operation of the memory package 11 of the groups A and B by the periodic signal applied to the ODT enable signal ODTEN and the chip enable signal CEn will be described. Here, the memory packages 11a to 11c (PKG1 to PKG3) are representatively shown.

For example, after the power has been turned on, the controller 100 executes a parameter writing operation (Set Feature) and sets various parameters. At this time, the controller 100 sets the interface chip 20, in which the ODT circuit 60 is to be turned on, from among the interface chips 20 of the respective memory packages.

First, in order to turn on the ODT circuit 60, the target ODT flag is set. In this example, the EFh command is issued from the controller 100, and the target ODT flag is set for the interface chips 20 in the respective memory packages 11a to 11d (PKG1 to PKG4).

Next, after the target ODT flag is set, a command for executing the Set Feature, for example, a D5h command is issued, and the non-target ODT flag is set in the interface chip 20 of the selected memory package 11. In this example, the non-target ODT flag is set in the interface chips 20 of the memory packages 11a and 11c (PKG1 and PKG3). When the target ODT flag is set, the target ODT flag is continuously set with a time difference so that the target ODT flag is not simultaneously set in a plurality of memory packages 11, unless the D5h command has the same chip address.

Next, Operation Examples 1 to 3 of continuous reading of data from the memory chip of the memory package 11 will be described.

[Operation Example 1] First, a description of [Operation Example 1] for the reading of data from one memory chip in the memory package 11a (PKG1) will be provided.

After setting the non-target ODT flag, the controller 100 issues a command (CMD) for data reading (DOUT) to all the memory chips. In response to this command, for example, in order to activate only one memory chip for the memory package 11a (PKG1) of the group A, the chip enable signal CEn1 is changed to the asserted state (L level). Next, after the assertion of the chip enable signal CEn1 has commenced, the ODT enable signal ODTEN is input, and a value of "0" is acquired in the first cycle and a value of "0" is acquired in the second cycle with respect to the periodic signal applied to the head. As "0" and "0" are acquired in the two cycles, the first ODT start condition is satisfied, and the ODT circuit 60 of the target ODT is turned on in the interface chip 20.

At the same time, the chip enable signal CEn is input to the memory package 11c (PKG3) of the group B. The chip enable signal CEn has a short assertion period. When the chip enable signal CEn1 is input, in the memory package 11c in which the non-target ODT is set, only the first cycle becomes "0" and the second cycle becomes "1". As "0" and "1" are acquired, the second ODT start condition is satisfied, and the ODT circuit 60 of the non-target ODT is turned on in the interface chip 20. At this time, even when the same ODT enable signal ODTEN is input to the memory package 11b (PKG2) paired with the memory package 11a, the memory chip of the memory package 11b is not activated, because the chip enable signal CEn input to the memory package 11b is negated ("H" level).

Next, after the ODT circuit 60 is turned on, the data read operation (DOUT) is performed. In this case, the data read operation is started, for example, after 300 nsec have elapsed since the command (CMD) was input. The data read from the memory chip of the memory package 11a (PKG1) is output to the controller 100 through the signal line DQ. Further, when the assertion of the chip enable signal CEn is ended, the ODT circuit 60 is also turned off.

[Operation Example 2] Next, a description of [Operation Example 2] for the reading of data from one memory chip in the memory package 11c (PKG3) will be provided.

After the data reading in the Operation Example 1 described above, the controller 100 issues the command (CMD) for data reading (DOUT) to all the memory chips. Subsequently, for example, in order to activate only one memory chip of the memory package 11c (PKG3) of the group B, the chip enable signal CEn is asserted ("L" level).

As described above, when the chip enable signal CEn is asserted ("L" level), the ODT enable signal ODTEN is also input to the memory chip of the memory package 11c (PKG3), and the first cycle becomes "0" and the second cycle becomes "0" with respect to the periodic signal applied to the head. At this time, the ODT circuit 60 of the target ODT is turned on, and the data read operation (DOUT) is performed.

At the same time, the chip enable signal CEn having a short assertion period is input to the memory package 11a (PKG1) of the group A, the ODT enable signal ODTEN is input, the first cycle becomes "0", and the second cycle becomes "1". As "0" and "1" are acquired, the second ODT start condition is satisfied, and the ODT circuit 60 of the non-target ODT is turned on.

As described above, even when the same ODT enable signal ODTEN is input to the memory package 11*b* (PKG2) paired with the memory package 11*a*, the memory chip of the memory package 11*b* is not activated, because the chip enable signal CEn input to the memory package 11*b* is not asserted ("H" level).

[Operation Example 3] Further, a description of [Operation Example 3] for the reading of data from one memory chip in the memory package 11*b* (PKG2) will be provided.

After the data reading of the Operation Example 2 described above, the controller 100 issues the command (CMD) of the data reading (DOUT) to all the memory chips. Subsequently, as described above, when the chip enable signal CEn is asserted (L level), the ODT enable signal ODTEN is input to one memory chip of the memory package 11*b* (PKG2) of the group A, and the first ODT start condition in which the first cycle is "0" and the second cycle is "0" with respect to the periodic signal is acquired. In accordance with the first ODT start condition, the ODT circuit 60 is turned on to execute the data read operation (DOUT).

Further, in the memory package 11*c* (PKG3) of the group B, only the first cycle becomes "0", and the second cycle becomes "1", so that the non-target ODT is set. Even when the same ODT enable signal ODTEN is input to the memory package 11*a* (PKG1), the memory chip of the memory package 11*a* is not activated because the chip enable signal CEn input to the memory package 11*a* is negated.

As described above, in the case where the memory package has the TSV structure, also, the same effects as those of the above-described MCP structure (First Embodiment-1) are obtained.

In the present embodiment, the non-target ODT circuit is set so as to be turned on when the chip enable signal CEn is detected in the order of "0" and "1", but it is also possible to set the non-target ODT circuit so as to be turned on when the chip enable signal CEn is detected in the order of "1" and "0". Furthermore, in the present embodiment, an example is described in which a periodic signal (or a clock signal) of two cycles is used, but the present invention is not particularly limited thereto, and it is also possible to increase the amount of information by using a periodic signal of three cycles or more. For example, the ODT signal can not only be switched on/off between two values, but also switched on a multi-level basis.

Second Embodiment

Next, a second embodiment will be described with reference to FIG. 13.

Figure 14:
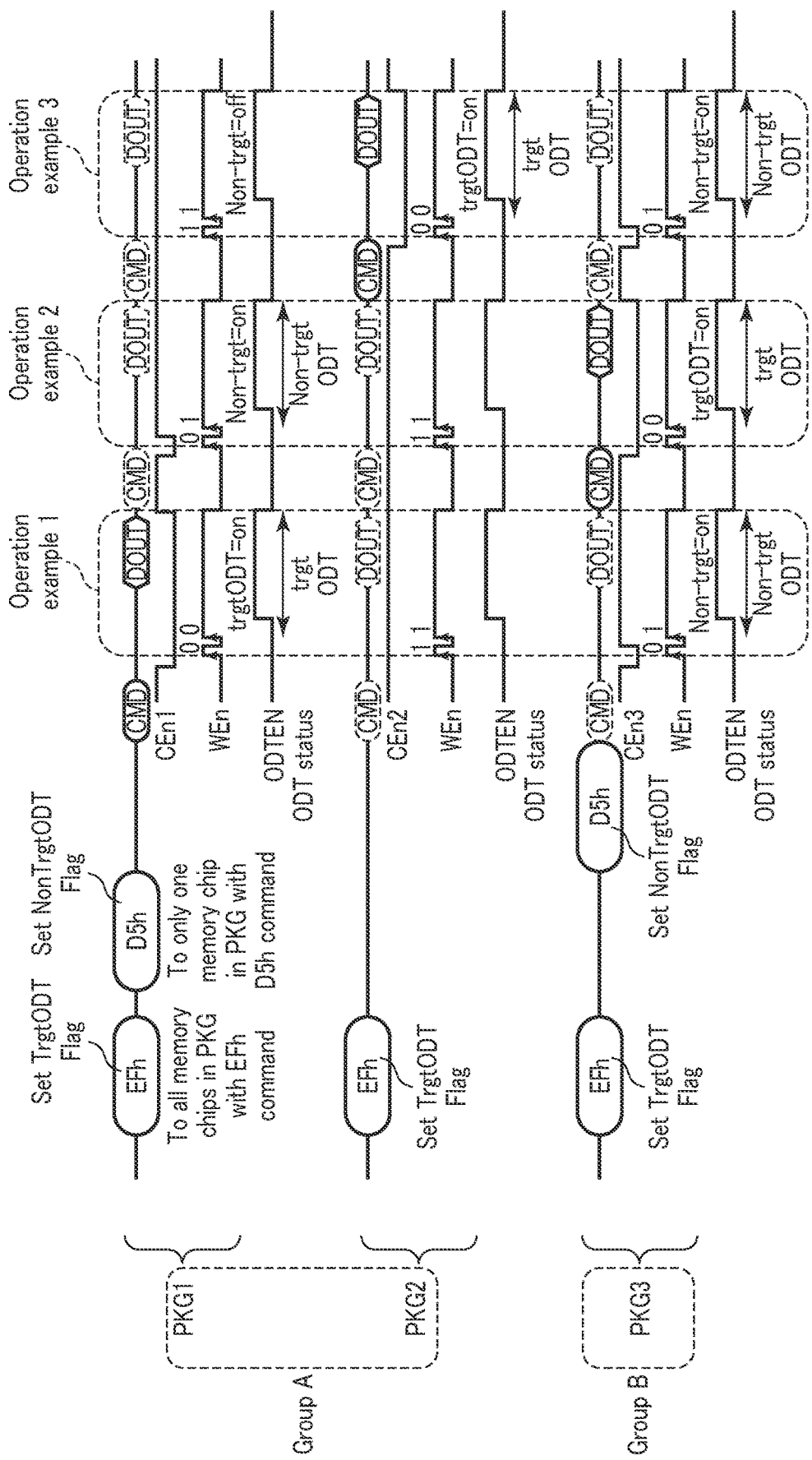
FIG. 14 is a timing chart for explaining on/off of an ODT circuit in a data read operation of the memory system according to the second embodiment.

The present embodiment is a configuration example in which the ODT activation condition is acquired by a write enable signal WEn provided with a periodic signal, such as a clock signal or a pulse waveform, on the head side, instead of the ODT enable signal ODTEN provided with a periodic signal on the head side described above. FIG. 14 shows a circuit configuration example of the memory system of the present embodiment. Similarly to the configuration shown in FIG. 6 described above, the memory packages 11*a* and 11*b* mounted in pairs on the mounting surfaces of the front and back surfaces of the PCB substrate 2 are referred to as a "group A", and the memory packages 11*c* and 11*d* are referred to as a "group B".

The ODT enable signal ODTEN and the write enable signal WEn are transmitted from the controller 100 to each memory package 11 through a common bus that is wired individually. The controller 100 transmits an individual chip enable signal CEn to each memory chip through an individual bus coupled to each memory package 11. The write enable signal wiring is an existing wiring and not newly added.

In the present embodiment, the above-described periodic signal is applied to the write enable signal WEn, and "0" and "1" are acquired from the assertion and negation of the chip enable signal CEn. Also in this embodiment, the first and second ODT start conditions are set in accordance with the truth tables shown in FIG. 7A and FIG. 7B described above. Normally, the write enable signal WEn is not cycled and has a fixed value while the ODT circuit 60 is on.

Figure 2:
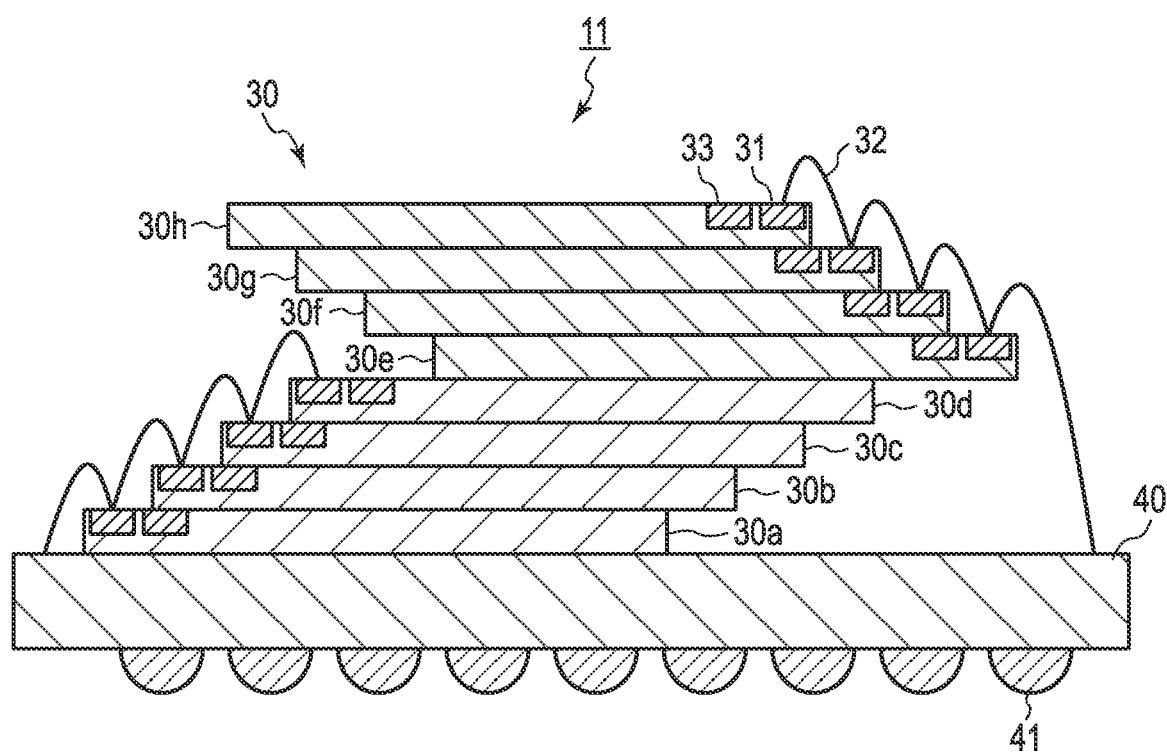
FIG. 2 is a cross-sectional view of a non-volatile semiconductor memory device (MCP) according to the first embodiment.

With reference to FIG. 2, an operation of reading data by turning on the ODT circuit using the write enable signal WEn provided with the periodic signal will be described.

The present embodiment is the same as the first embodiment described above until the setting of the non-target ODT flag is completed.

First, as described above, the controller 100 sets various parameters after the power is turned on. At this time, the controller 100 sets the memory chip 30 in which the ODT circuit 60 is turned on to the ODT control circuit 52 in the interface chip 20 of each memory 10.

Next, an EFh command is issued from the controller 100, and a target ODT flag is set for all the memory chips in each of the memory packages 11*a* to 11*d* (PKG1 to PKG4). Subsequently, after the target ODT flag is set, for example, a D5h command is issued, and a non-target ODT flag is set in one memory chip in each memory package 11. In this example, the non-target ODT flag is set in one of the memory chips in the memory packages 11*a* and 11*c* (PKG1 and PKG3).

Next, Operation Examples 1 to 3 of continuously reading data from the memory chip of the memory package 11 will be described. In the Operation Examples 1 to 3, the memory chip from which data is read and the memory chip in which the non-target ODT flag is set are the same as those in the first embodiment described above.

FIG. 14 shows a timing chart of data reading during the assertion (L level) period of the chip enable signal CEn.

[Operation Example 1] A description of [Operation Example 1] for the reading of data from one memory chip in the memory package 11*a* (PKG1) will be provided.

After setting the non-target ODT flag, the controller 100 issues a command (CMD) for data reading (DOUT) to all the memory chips. In response to this command, under the control of the ODT control circuit 52, for example, in order to activate only one memory chip for the memory package 11*a* (PKG1) of the group A, a chip enable signal CEn1 is asserted ("L" level). Next, after the assertion of the chip enable signal CEn1 is started, the controller 100 generates a periodic signal of at least two cycles to the head side of the write enable signal WEn. When "0" is acquired in the first cycle and "0" is acquired in the second cycle with respect to the periodic signal, the ODT circuit 60 of the target ODT is turned on to satisfy the ODT start condition shown in FIG. 7A. After the ODT circuit 60 is turned on, the data read operation (DOUT) is performed. When the asserted state of the chip enable signal CEn1 ends, the ODT circuit 60 is turned off.

At the same time, under the control of the ODT control circuit 52, the chip enable signal CEn is asserted for a short period so that the first cycle becomes "0" and the second cycle becomes "1" by the periodic signal provided in the write enable signal WEn with respect to the memory package 11*c* (PKG3) of the group B. By the assertion of the chip enable signal CEn, the non-target ODT start condition shown in FIG. 7B described above is satisfied, and the ODT circuit 60 of the non-target ODT of the memory chip of the memory package 11c (PKG3) is turned on. At this time, the write enable signal WEn provided with the periodic signal is also input to the memory package 11b (PKG2) paired with the memory package 11a. However, since the chip enable signal CEn input to the memory package 11b is not asserted ("H" level), "1" and "1" are acquired. Thus, the non-target ODT start condition is not satisfied, and the memory chip in the memory package 11b is not activated.

[Operation Example 2] Next, a description of [Operation Example 2] for the reading of data from one memory chip in the memory package 11c (PKG3) will be provided.

After the data reading in the Operation Example 1 described above, the controller 100 issues the command (CMD) for data reading (DOUT) to all the memory chips. Subsequently, for example, in order to activate only one memory chip for the memory package 11c (PKG3) of the group B, the chip enable signal CEn is asserted ("L" level).

Also in the memory chip of the memory package 11c (PKG3), as described above, when the chip enable signal CEn is asserted, the ODT circuit 60 of the target ODT is turned on by the periodic signal provided in the write enable signal WEn.

At the same time, with respect to the memory package 11a (PKG1) of the group A, the chip enable signal CEn is input in which only the first cycle becomes "0" and the second cycle becomes "1" in the periodic signal provided in the write enable signal WEn. Through the input of the chip enable signal CEn, the non-target ODT is set in the memory chip of the memory package 11a (PKG1). After the ODT circuit 60 is turned on, the data read operation (DOUT) is performed. As described above, even when the same write enable signal WEn is input to the memory package 11b (PKG2) paired with the memory package 11a, the memory chip of the memory package 11b is not activated, because the chip enable signal CEn input to the memory package 11b is not asserted ("H" level).

[Operation Example 3] Further, a description of [Operation Example 3] for the reading of data from one memory chip in the memory package 11b (PKG2) will be provided.

After the data reading of the Operation Example 2 described above, the controller 100 issues the command of the data reading (DOUT) to all the memory chips. Subsequently, as described above, the chip enable signal CEn is input to one memory chip of the memory package 11b (PKG2) of the group A. When the chip enable signal CEn is asserted (L level), the periodic signal applied to the write enable signal WEn is input. With respect to this periodic signal, the ODT start condition of the first cycle "0" and the second cycle "0" is acquired. In accordance with the ODT start condition, the ODT circuit 60 is turned on, the target ODT is turned on, and the data read operation (DOUT) is performed.

At the same time, the chip enable signal CEn in which the assertion period is set is input to the memory package 11c (PKG3) of the group B so that only the first cycle becomes "0" and the second cycle becomes "1". By the input of the chip enable signal CEn, the non-target ODT is set in the memory chip of the memory package 11c (PKG3). Also in this operation example, as described above, even when the periodic signal applied to the same write enable signal WEn is input to the memory package 11a (PKG1) paired with the memory package 11b, the memory chip of the memory package 11a is not activated because the chip enable signal CEn input to the memory package 11a is not asserted ("H" level).

As described above, also in this embodiment, it is possible to provide a non-volatile semiconductor memory device and a control method capable of improving the processing capacity without a malfunction.

Specifically, it is possible to set at least four ODT start conditions by two cycles for the chip enable signal CEn asserted and negated by using not only the ODT enable signal ODTEN to which the periodic signal is applied at the head but also the periodic signal applied to the head of the write enable signal WEn. Further, it is possible to realize a precise control of the on/off of the target ODT and the non-target ODT while minimizing the overhead of the data transfer throughput without increasing the number of control pins.

In the embodiments described above, the ODTEN signal commonly supplied to all the packages PKG is used as a clock signal, and the chip enable signal CEn individually supplied to the packages PKG is used as a data signal.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A memory system comprising:
   a plurality of memory packages coupled by a common bus and arranged in groups, each group including a pair of memory packages facing each other, and each memory package including a plurality of memory chips;
   on-die termination (ODT) circuits respectively disposed in the memory packages and configured to suppress reflection of a signal; and
   a controller configured to perform writing or reading of data to or from a memory chip of a designated memory package through the common bus,
   wherein the ODT circuits are on/off controlled based on an asserted state of a chip enable signal CEn acquired using a periodic signal of at least two cycles.

2. The memory system according to claim 1, wherein the controller maintains ODT start conditions for turning on the ODT circuits set by a 2-bit information signal defined by the periodic signal of at least two cycles,
   the ODT start conditions including:
   a first ODT start condition, in a case in which the controller selects a memory package to write or read data, for turning on an ODT circuit included in the memory package to turn on a target ODT, after the chip enable signal CEn to drive a memory chip included in the memory package has been asserted, when the asserted state of the chip enable signal CEn is detected twice in succession based on the periodic signal and if the asserted state is detected continuously; and
   a second ODT start condition, in a case in which the controller does not select the memory package, for turning on the ODT circuit included in the memory package to turn on a non-target ODT, after the chip enable signal CEn to drive the memory chip included in the memory package has been asserted, when the asserted state of the chip enable signal CEn is detected twice in succession based on the periodic signal and if a first detection result is the asserted state and a second detection result is a negated state.

3. The memory system according to claim 1, wherein the periodic signal has a period of at least two cycles and is applied to a head side of an ODT enable signal ODTEN.

4. The memory system according to claim 1, wherein the periodic signal has a period of at least two cycles and is applied to a head side of a write enable signal WEn.

5. The memory system according to claim 2, wherein each of the ODT circuits is on/off-controlled based on the asserted state of the chip enable signal CEn, the first ODT start condition, and the second ODT start condition, when a target ODT flag is set in all the memory chips and a non-target ODT flag is set in one memory chip in each of the memory packages.

6. The memory system according to claim 1, wherein the pair of memory packages are mounted on mounting surfaces of both front and back surfaces of a circuit board so as to face each other with the circuit board interposed therebetween.

7. The memory system according to claim 1, wherein one cycle from a first rising edge to a second rising edge of the periodic signal has a time width of four times a switching time period of a write enable signal WEn.

8. The memory system according to claim 1, wherein each of the plurality of memory packages includes a plurality of NAND flash memories stacked on one another, each of the plurality of NAND flash including a memory cell.

9. A non-transitory computer readable medium storing a program that causes a hardware processor included in the controller to function as each unit included in the memory system according to claim 1.

10. A memory system comprising:
a plurality of memory packages coupled by a common bus and arranged in groups, each group including a pair of memory packages facing each other, and each memory package including a plurality of memory chips;
on-die termination (ODT) circuits respectively disposed in the memory chips and configured to suppress reflection of a signal; and
a controller configured to perform writing or reading of data to or from a memory chip of a designated memory package through the common bus,
wherein the ODT circuits are on/off controlled based on an asserted state of a chip enable signal CEn acquired using a periodic signal of at least two cycles.

11. The memory system according to claim 10, wherein the controller maintains ODT start conditions for turning on the ODT circuits set by a 2-bit information signal defined by the periodic signal of at least two cycles,
the ODT start conditions including:
a first ODT start condition, in a case in which the controller selects a memory package to write or read data, for turning on an ODT circuit included in a memory chip to turn on a target ODT, after the chip enable signal CEn to drive the memory chip included in the memory package has been asserted, when the asserted state of the chip enable signal CEn is detected twice in succession based on the periodic signal and if the asserted state is detected continuously; and
a second ODT start condition, in a case in which the controller does not select the memory package, for turning on the ODT circuit included in the memory chip to turn on a non-target ODT, after the chip enable signal CEn to drive the memory chip included in the memory package has been asserted, when the asserted state of the chip enable signal CEn is detected twice in succession based on the periodic signal and if a first detection result is the asserted state and a second detection result is a negated state.

12. The memory system according to claim 10, wherein the periodic signal has a period of at least two cycles and is applied to a head side of an ODT enable signal ODTEN.

13. The memory system according to claim 10, wherein the periodic signal has a period of at least two cycles and is applied to a head side of a write enable signal WEn.

14. The memory system according to claim 11, wherein each of the ODT circuits is on/off-controlled based on the asserted state of the chip enable signal CEn, the first ODT start condition, and the second ODT start condition, when a target ODT flag is set in all the memory chips and a non-target ODT flag is set in one memory chip in each of the memory packages.

15. The memory system according to claim 10, wherein the pair of memory packages are mounted on mounting surfaces of both front and back surfaces of a circuit board so as to face each other with the circuit board interposed therebetween.

16. The memory system according to claim 10, wherein one cycle from a first rising edge to a second rising edge of the periodic signal has a time width of four times a switching time period of a write enable signal WEn.

17. A non-transitory computer readable medium storing a program that causes a hardware processor included in the controller to function as each unit included in the memory system according to claim 10.

18. A control method for a memory system comprising: a plurality of memory packages coupled by a common bus and arranged in groups, each group including a pair of memory packages facing each other, and each memory package including a plurality of memory chips; on-die termination (ODT) circuits respectively disposed in the memory packages and configured to suppress reflection of a signal; and a controller configured to perform writing or reading of data to or from a memory chip of a designated memory package through the common bus,
wherein the controller includes: a first ODT start condition and a second ODT start condition set by a 2-bit information signal defined by a periodic signal of at least two cycles applied to a head of a control signal, the method comprising:
as the first ODT start condition,
in a case in which the controller selects a memory package to write or read data, turning on an ODT circuit included in the memory package to turn on a target ODT, after the chip enable signal CEn to drive a memory chip included in the memory package has been asserted, when the asserted state of the chip enable signal CEn is detected twice in succession based on the periodic signal and if the asserted state is detected continuously; and
as the second ODT start condition,
in a case in which the controller does not select the memory package, turning on the ODT circuit included in the memory package to turn on a non-target ODT, after the chip enable signal CEn to drive the memory chip included in the memory package has been asserted, when the asserted state of the chip enable signal CEn is detected twice in succession based on the periodic signal and if a first detection result is the asserted state and a second detection result is a negated state.

19. A control method for a memory system comprising: a plurality of memory packages coupled by a common bus and arranged in groups, each group including a pair of memory packages facing each other, and each memory package including a plurality of memory chips; on-die termination (ODT) circuits respectively disposed in the memory chips and configured to suppress reflection of a signal; and a controller configured to perform writing or reading of data to or from a designated memory chip through the common bus, wherein the controller includes: a first ODT start condition and a second ODT start condition set by a 2-bit information signal defined by a periodic signal of at least two cycles applied to a head of a control signal, the method comprising:

as the first ODT start condition, in a case in which the controller selects a memory package to write or read data, turning on an ODT circuit included in a memory chip to turn on a target ODT, after the chip enable signal CEn to drive the memory chip included in the memory package has been asserted, when the asserted state of the chip enable signal CEn is detected twice in succession based on the periodic signal and if the asserted state is detected continuously; and as the second ODT start condition, in a case in which the controller does not select the memory package, turning on the ODT circuit included in the memory chip to turn on a non-target ODT, after the chip enable signal CEn to drive the memory chip included in the memory package has been asserted, when the asserted state of the chip enable signal CEn is detected twice in succession based on the periodic signal and if a first detection result is the asserted state and a second detection result is a negated state.

* * * * *